US010700146B2

(12) United States Patent
Chai et al.

(10) Patent No.: US 10,700,146 B2
(45) Date of Patent: Jun. 30, 2020

(54) PIXEL AND ORGANIC LIGHT-EMITTING DISPLAY DEVICE HAVING THE SAME

(71) Applicants: SAMSUNG DISPLAY CO., LTD., Yongin-si, Gyeonggi-do (KR); IUCF-HYU (Industry-University Cooperation Foundation Hanyang University), Seoul (KR)

(72) Inventors: Chong Chul Chai, Yongin-si (KR); Oh Kyong Kwon, Seoul (KR); Nack Hyeon Keum, Seoul (KR); Kyong Hwan Oh, Seoul (KR); Bo Yong Chung, Yongin-si (KR); An Su Lee, Yongin-si (KR)

(73) Assignees: SAMSUNG DISPLAY CO., LTD., Yongin-si, Gyeonggi-Do (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 176 days.

(21) Appl. No.: 15/838,693

(22) Filed: Dec. 12, 2017

(65) Prior Publication Data

US 2018/0166516 A1    Jun. 14, 2018

(30) Foreign Application Priority Data

Dec. 12, 2016  (KR) .................. 10-2016-0168755

(51) Int. Cl.
*G09G 3/3233* (2016.01)
*G09G 3/3225* (2016.01)
*H01L 27/32* (2006.01)

(52) U.S. Cl.
CPC ....... *H01L 27/3244* (2013.01); *G09G 3/3233* (2013.01); *H01L 27/32* (2013.01);
(Continued)

(58) Field of Classification Search
CPC .......... G09G 3/22; G09G 3/3208; G09G 3/30; G09G 3/3225; G09G 3/3233;
(Continued)

(56) References Cited

U.S. PATENT DOCUMENTS

| 7,768,485 B2 | 8/2010 | Uchino et al. |
| 8,077,126 B2 | 12/2011 | Lee et al. |

(Continued)

FOREIGN PATENT DOCUMENTS

| KR | 10-2011-0123984 A | 11/2011 |
| KR | 10-1424693 B1 | 8/2014 |
| KR | 10-1498094 B1 | 3/2015 |

OTHER PUBLICATIONS

S.M. Choi, et al., A Self-compensated Voltage Programming Pixel Structure for Active-Matrix Organic Light Emitting Diodes, IDW Tech. Digest, 535-538 (2003).

*Primary Examiner* — William Lu
(74) *Attorney, Agent, or Firm* — Kile Park Reed & Houtteman PLLC

(57) ABSTRACT

A pixel includes first through fourth transistors and storage capacitor. The first transistor controls an amount of current flowing from a first driving power source to a second driving power source, via an organic light-emitting diode, based on a voltage of a first node. The second transistor is coupled between a first electrode of the first transistor and the first node, and is turned on when a scan signal is supplied to a scan line. The third transistor is coupled between a second electrode of the first transistor and a reference power source, and is turned on when the scan signal is supplied. The fourth transistor is coupled between an anode electrode of the organic light-emitting diode and a data line, and is turned on when the scan signal is supplied. The storage capacitor is coupled between the first node and the anode electrode of the organic light-emitting diode.

39 Claims, 32 Drawing Sheets

(52) U.S. Cl.
CPC ...... *H01L 27/3262* (2013.01); *H01L 27/3276* (2013.01); *G09G 3/3225* (2013.01); *G09G 2300/0819* (2013.01); *G09G 2300/0842* (2013.01); *G09G 2300/0861* (2013.01); *G09G 2310/0251* (2013.01); *G09G 2310/0262* (2013.01); *G09G 2320/043* (2013.01)

(58) Field of Classification Search
CPC ............... G09G 3/3241; G09G 3/3266; G09G 3/3275; G09G 3/3258
See application file for complete search history.

(56) References Cited

U.S. PATENT DOCUMENTS

| | | | | |
|---|---|---|---|---|
| 8,736,523 | B2* | 5/2014 | Chung | G09G 3/3233 345/76 |
| 8,928,564 | B2 | 1/2015 | Park et al. | |
| 9,129,927 | B2 | 9/2015 | Gupta et al. | |
| 10,198,995 | B1* | 2/2019 | Chen | G09G 3/3258 |
| 10,304,378 | B2* | 5/2019 | Lin | G09G 3/3225 |
| 10,475,385 | B2* | 11/2019 | Xu | G09G 3/3258 |
| 2009/0213046 | A1* | 8/2009 | Nam | G09G 3/3233 345/76 |
| 2011/0074757 | A1* | 3/2011 | Chung | G09G 3/3233 345/211 |
| 2011/0164016 | A1* | 7/2011 | Kang | G09G 3/3233 345/211 |
| 2011/0279437 | A1* | 11/2011 | Komiya | G09G 3/3233 345/212 |
| 2012/0139890 | A1* | 6/2012 | Choi | G09G 3/3233 345/212 |
| 2012/0206168 | A1* | 8/2012 | Park | H03K 19/20 327/108 |
| 2013/0300639 | A1* | 11/2013 | Kim | G09G 3/3233 345/83 |
| 2014/0347405 | A1* | 11/2014 | Kumeta | G09G 5/10 345/690 |
| 2016/0012800 | A1* | 1/2016 | Han | G09G 3/3208 345/213 |
| 2016/0063921 | A1* | 3/2016 | Tsai | G09G 3/3233 345/76 |
| 2016/0104419 | A1* | 4/2016 | Chung | G09G 3/3225 345/78 |
| 2016/0293105 | A1* | 10/2016 | Wang | G09G 3/3233 |
| 2016/0351121 | A1* | 12/2016 | Kim | G09G 3/3233 |

* cited by examiner

PIXEL AND ORGANIC LIGHT-EMITTING DISPLAY DEVICE HAVING THE SAME

CROSS-REFERENCE TO RELATED APPLICATION

Korean Patent Application No. 10-2016-0168755, filed on Dec. 12, 2016, and entitled: "Pixel and Organic Light-Emitting Display Device Having the Same," is incorporated by reference herein in its entirety.

BACKGROUND

1. Field

One or more embodiments herein relate an organic light-emitting display device.

2. Description of the Related Art

A variety of displays have been developed. Examples include a liquid crystal display and an organic light-emitting display. An organic light-emitting display generates images based on light from pixels that have organic light-emitting diodes. Organic light-emitting displays have low power consumption and high response speed.

In an organic light-emitting display, signals are supplied to pixels through data lines and scan lines. Each pixel has a driving transistor for controlling the amount of current flowing through to organic light-emitting diode. More specifically, the driving transistor controls the amount of current that flows from a first driving power source to a second driving power source via the organic light-emitting diode based on a data signal. The organic light-emitting diode emits light having predetermined luminance based on the amount of current from the driving transistor.

One method for controlling pixels in an organic light-emitting display involves setting the voltage of the second driving power source to a low voltage to achieve high luminance. Another method involves driving the organic light-emitting display at a low frequency in an attempt to minimize power consumption.

However, these methods allow a predetermined leakage current to produce from the gate electrode of the driving transistor. In this case, the voltage of a data signal is not maintained for one frame period. As a result, an image having desired luminance is not displayed. Further, the voltage of the second driving power source may be set to different values for respective pixel positions due to voltage drop. This may also adversely affect display of a desired luminance.

SUMMARY

In accordance with one or more embodiments, a pixel includes an organic light-emitting diode; a first transistor to control an amount of current that flows from a first driving power source to a second driving power source, via the organic light-emitting diode, based on a voltage of a first node; a second transistor coupled between a first electrode of the first transistor and the first node, the second transistor to be turned on when a scan signal is supplied to a scan line; a third transistor coupled between a second electrode of the first transistor and a reference power source, the third transistor to be turned on when the scan signal is supplied; a fourth transistor coupled between an anode electrode of the organic light-emitting diode and a data line, the fourth transistor to be turned on when the scan signal is supplied; and a storage capacitor coupled between the first node and the anode electrode of the organic light-emitting diode.

A fifth transistor may be coupled between the second electrode of the first transistor and the anode electrode of the organic light-emitting diode, the fifth transistor to be turned off when a first emission control signal is supplied to a first emission control line; and a sixth transistor may be coupled between the first driving power source and the first electrode of the first transistor, the sixth transistor to be turned off when a second emission control signal is supplied to a second emission control line.

The second transistor may have a turn-on period that does not overlap a turn-on period of the fifth transistor. The second transistor may have a turn-on period that partially overlaps a turn-on period of the sixth transistor. Each of the first to sixth transistors may be an N-type transistor. The first transistor, the fifth transistor, and the sixth transistor may be polysilicon semiconductor transistors.

The first driving power source may have a voltage higher than that of the reference power source. The data signal may have a voltage lower than that of the second driving power source. At least one of the second transistor, the third transistor, or the fourth transistor may be an oxide semiconductor transistor. At least one of the second transistor, the third transistor, or the fourth transistor may include a plurality of transistors connected in series.

At least one of the second transistor, the third transistor, or the fourth transistor may be a double-gate transistor with two gate electrodes. A first gate electrode and a second gate electrode of the second transistor may be coupled to the scan line. A first gate electrode of the second transistor may be coupled to the scan line, and a second gate electrode of the second transistor may be coupled to a bias power source. A voltage of the bias power source may be changed at predetermined intervals, so the bias power source has a voltage lower or higher than a voltage supplied to the first gate electrode.

A first gate electrode and a second gate electrode of the third transistor may be coupled to the scan line. A first gate electrode of the third transistor may be coupled to the scan line, and a second gate electrode of the third transistor may be coupled to a bias power source. A voltage of the bias power source may be changed at predetermined intervals, so that the bias power source has a voltage lower than or higher than a voltage that is supplied to the first gate electrode. A first gate electrode and a second gate electrode of the fourth transistor may be coupled to the scan line.

A first gate electrode of the fourth transistor may be coupled to the scan line, and a second gate electrode of the fourth transistor may be coupled to a bias power source. A voltage of the bias power source may be changed at predetermined intervals, so that the bias power source has a voltage lower than or higher than a voltage that is supplied to the first gate electrode.

The pixel may include a fifth transistor coupled between the first electrode of the first transistor and the second transistor or between the first node and the second transistor, the fifth transistor having a gate electrode coupled to a control power source. The fifth transistor may be an oxide semiconductor transistor. When the pixel is driven at a first driving frequency, a voltage of the control power source may allow the fifth transistor to remain turned on, and when the pixel is driven at a second driving frequency lower than the first driving frequency, the voltage of the control power source may allow the fifth transistor to be turned off. When the pixel is driven at the second driving frequency, the fifth transistor may be turned off after a voltage of the data signal is stored in the storage capacitor.

The pixel may include a fifth transistor coupled between the second electrode of the first transistor and the third transistor or between the third transistor and the reference power source, the fifth transistor having a gate electrode coupled to a control power source. The fifth transistor may be an oxide semiconductor transistor. When the pixel is driven at a first driving frequency, a voltage of the control power source may allow the fifth transistor to remain turned on, and when the pixel is driven at a second driving frequency lower than the first driving frequency, the voltage of the control power source may allow the fifth transistor to be turned off. When the pixel is driven at the second driving frequency, the fifth transistor may be turned off after a voltage of the data signal is stored in the storage capacitor.

The pixel may include a fifth transistor coupled between the anode electrode of the organic light-emitting diode and the fourth transistor or between the fourth transistor and the data line, the fifth transistor having a gate electrode coupled to a control power source. The fifth transistor may be an oxide semiconductor transistor. When the pixel is driven at a first driving frequency, a voltage of the control power source may allow the ninth transistor to remain turned on, and when the pixel is driven at a second driving frequency lower than the first driving frequency, the voltage of the control power source may allow the ninth transistor to be turned off. When the pixel is driven at the second driving frequency, the fifth transistor may be turned off after a voltage of the data signal is stored in the storage capacitor.

In accordance with one or more other embodiments, an organic light-emitting display device which includes a plurality of pixels coupled to scan lines, data lines, first emission control lines, and second emission control lines; a scan driver to supply a scan signal to the scan lines; and an emission driver to supply a first emission control signal to the first emission control lines and supply a second emission control signal to the second emission control lines, wherein a pixel among the pixels in an i-th horizontal line includes: an organic light-emitting diode; a first transistor to control an amount of current that flows from a first driving power source into a second driving power source, via the organic light-emitting diode, based on a voltage of a first node; a second transistor coupled between a first electrode of the first transistor and the first node, the second transistor to be turned on when a scan signal is supplied to an i-th scan line; a third transistor coupled between a second electrode of the first transistor and a reference power source, the third transistor to be turned on when the scan signal is supplied to the i-th scan line; a fourth transistor coupled between an anode electrode of the organic light-emitting diode and a data line, the fourth transistor to be turned on when the scan signal is supplied to the i-th scan line; and a storage capacitor coupled between the first node and the anode electrode of the organic light-emitting diode.

The pixel may include a fifth transistor coupled between the second electrode of the first transistor and the anode electrode of the organic light-emitting diode, the fifth transistor to be turned off when the first emission control signal is supplied to an i-th first emission control line; and a sixth transistor between the first driving power source and the first electrode of the first transistor, the sixth transistor to be turned off when the second emission control signal is supplied to an i-th second emission control line.

The emission driver may supply the second emission control signal to the i-th second emission control line after supplying the first emission control signal to the i-th first emission control line. The second emission control signal supplied to the i-th second emission control line may have a period that partially overlaps a period of the first emission control signal supplied to the i-th first emission control line. The scan driver may supply the scan signal to the i-th scan line, so that a period of the scan signal completely overlaps a period of the first emission control signal supplied to the i-th first emission control line and partially overlaps a period of the second emission control signal supplied to the i-th second emission control line. Each of the first to sixth transistors may be an N-type transistor. The first driving power source may have a voltage higher than that of the reference power source. The data signal may have a voltage lower than that of the second driving power source.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
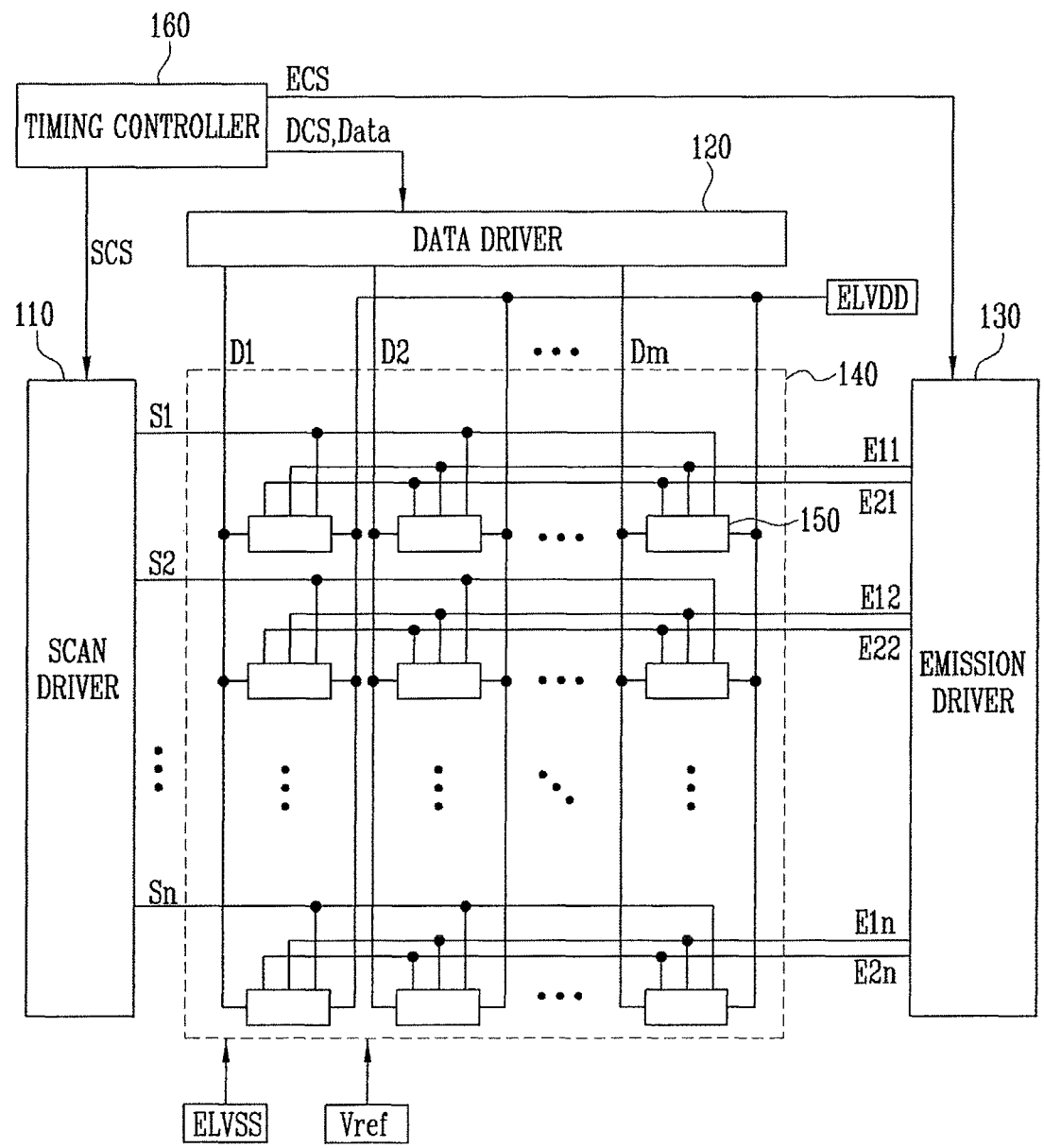
FIG. 1 illustrates an embodiment of an organic light-emitting display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of an organic light-emitting display device which may include pixels 150 disposed to be coupled to scan lines S1 to Sn, emission control lines E11 to E1$n$ and E21 to E2$n$, and data lines D1 to Dm, a scan driver 110 for driving the scan lines S1 to Sn, a data driver 120 for driving the data lines D1 to Dm, an emission driver 130 for driving the emission control lines E11 to E1$n$ and E21 to E2$n$, and a timing controller 160 for controlling the scan driver 110, the data driver 120, and the emission driver 130.

The timing controller 160 may generate a data driving control signal DCS, a scan driving control signal SCS, and an emission driving control signal ECS based on synchronization signals that are externally supplied. The scan driving control signal SCS generated by the timing controller 160 is supplied to the scan driver 110. The data driving control signal DCS is supplied to the data driver 120. The emission driving control signal ECS is supplied to the emission driver 130. Further, the timing controller 160 realigns externally supplied data Data and supplies the realigned data to the data driver 120.

The scan driving control signal SCS includes a scan start pulse and clock signals. The scan start pulse controls a first timing of a scan signal. The clock signals are used to shift the scan start pulse.

The data driving control signal DCS includes a source start pulse and clock signals. The source start pulse controls the time at which the sampling of data starts. The clock signals are used to control a sampling operation.

The emission driving control signal ECS includes a first emission start pulse, a second emission start pulse, and clock signals. The first emission start pulse may control a first timing of a first emission control signal supplied to the first emission control lines E11 to E1$n$. The second emission start pulse may control a first timing of a second emission control signal supplied to the second emission control lines E21 to E2$n$. The clock signals are used to shift the first emission start pulse and the second emission start pulse.

The scan driver 110 is supplied with the scan driving control signal SCS from the timing controller 160. The scan driver 110 provides scan signals to the scan lines S1 to Sn based on the scan driving control signal SCS. For example, the scan driver 110 may sequentially provide scan signals to the scan lines S1 to Sn. When the scan signals are sequentially provided to the scan lines S1 to Sn, the pixels 150 are selected on a horizontal line basis.

The emission driver 130 is supplied with the emission driving control signal ECS from the timing controller 160. The emission driver 130 provides the first emission control signal to the first emission control lines E11 to E1$n$ and provides the second emission control signal to the second emission control lines E21 to E2$n$ based on the emission driving control signal ECS. For example, the emission driver 130 may sequentially provide the first emission control signal to the first emission control lines E11 to E1$n$ and may sequentially provide the second emission control signal to the second emission control lines E21 to E2$n$.

The emission driver 130 may provide the second emission control signal to an i-th (where i is a natural number) second emission control line E2$i$, so that the period of the second emission control signal partially overlaps that of the first emission control signal provided to an i-th first emission control line E1$i$. For this operation, the emission driver 130 may provide the second emission control signal to the i-th second emission control line E2$i$ after the first emission control signal has been provided to the i-th first emission control line E1$i$.

The scan driver 110 may supply a scan signal to an i-th scan line Si, so that the period of the scan signal completely overlaps that of the first emission control signal provided to the i-th first emission control line E1$i$ and partially overlaps that of the second emission control signal provided to the i-th second emission control line E2$i$. The scan signal may be set to a gate-on voltage, for example, a high voltage, to turn on transistors in the pixels 150. The first emission control signal and the second emission control signal may be set to a gate-off voltage, for example, a low voltage, to turn off the transistors in the pixels 150.

The scan driver 110 and the emission driver 130 are illustrated as separate drivers in FIG. 1. In one embodiment, the scan driver 110 and the emission driver 130 may be implemented as a single driver. Further, the scan driver 110 and/or the emission driver 130 may be mounted on a substrate through a thin-film process. Furthermore, the scan driver 110 and/or emission driver 130 may be at opposite sides of a pixel unit 140.

The data driver 120 supplies data signals to the data lines D1 to Dm based on the data driving control signal DCS. The data signals supplied to the data lines D1 to Dm are provided to pixels 150 selected by the scan signal. For this operation, the data driver 120 may supply data signals to the data lines D1 to Dm in synchronization with the scan signal. In one embodiment, the data signals may be set to voltages lower than that of a second driving power source ELVSS.

The pixel unit 140 includes pixels 150 coupled to the scan lines S1 to Sn, the emission control lines E11 to E1$n$ and E21 to E2$n$, and the data lines D1 to Dm. The pixels 150 are supplied with the voltages of a first driving power source ELVDD, the second driving power source ELVSS, and a reference power source Vref from the outside of the display device.

Each of the pixels 150 includes a driving transistor and an organic light-emitting diode (OLED). The driving transistor controls the amount of current that flows from the first driving power source ELVDD to the second driving power source ELVSS, via the organic light-emitting diode (OLED), based on a data signal.

N scan lines S1 to Sn and N emission control lines E11 to E1$n$ and E21 to E2$n$ are illustrated in FIG. 1. In one embodiment, for stability of driving, dummy scan lines, first dummy emission control lines and/or second dummy emission control lines may be additionally formed.

Figure 2:
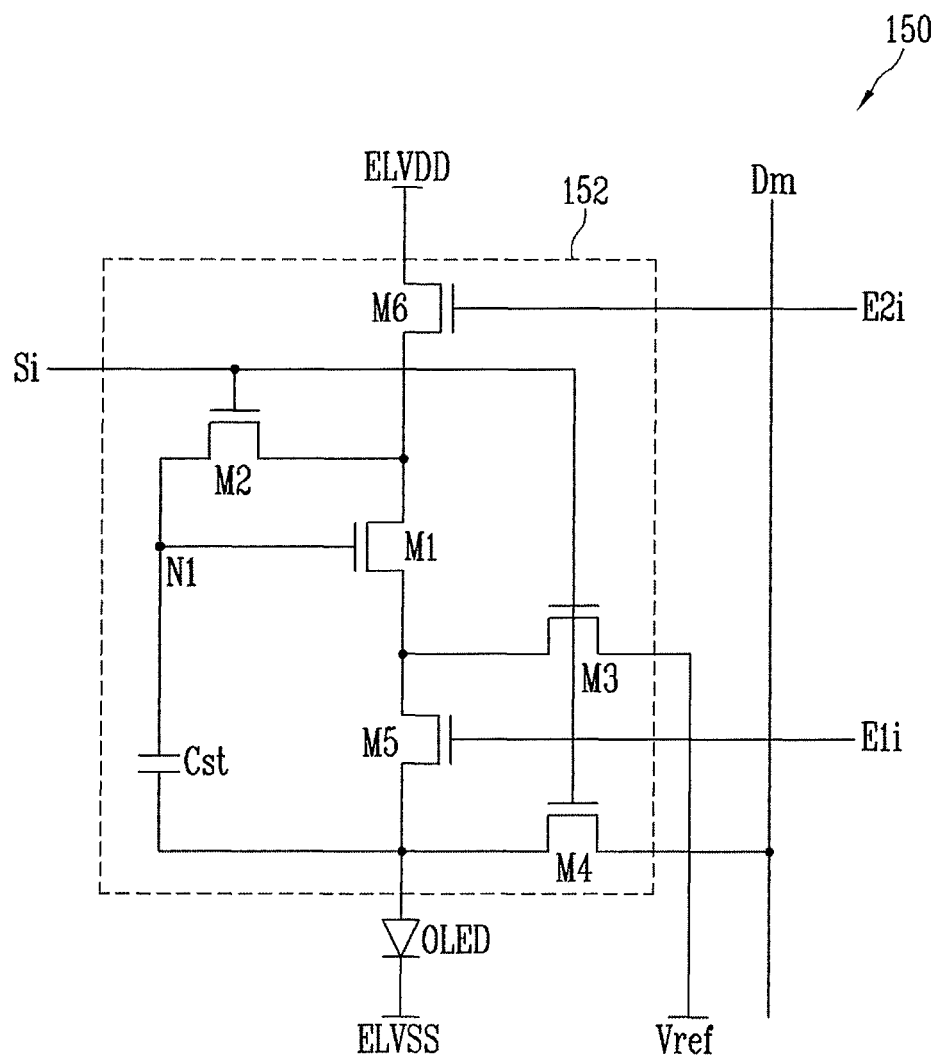
FIG. 2 illustrates an embodiment of a pixel.

FIG. 2 illustrates an embodiment of a pixel, which, for example, may be representative of the pixels 150 in the display device of FIG. 1. For illustrative purposes, the pixel 150 in FIG. 2 is on an i-th horizontal line and coupled to an m-th data line Dm.

Referring to FIG. 2, the pixel 150 may include a pixel circuit 152 and an organic light-emitting diode (OLED). The OLED includes an anode electrode coupled to the pixel circuit 152 and a cathode electrode coupled to a second driving power source ELVSS. The OLED generates light having predetermined luminance depending on the amount of current supplied from the pixel circuit 152.

The pixel circuit 152 controls the amount of current that flows from a first driving power source ELVDD to the second driving power source ELVSS, via the OLED, based on a data signal. The voltage of the first driving power source ELVDD may be set to a voltage higher than that of the second driving power source ELVSS. The pixel circuit 152 includes a storage capacitor Cst, and a first transistor M1 to a sixth transistor M6. The first transistor M1 to the sixth transistor M6 may be N-type transistors.

A first electrode of the first transistor M1 is coupled to the first driving power source ELVDD via the sixth transistor M6, a second electrode of the first transistor M1 is coupled to the anode electrode of the OLED via the fifth transistor M5, and a gate electrode of the first transistor M1 is coupled to a first node N1. The first transistor M1 controls the amount of current that flows from the first driving power source ELVDD to the second driving power source ELVSS, via the OLED, based on the voltage of the first node N1.

The second transistor M2 is coupled between the first electrode of the first transistor M1 and the first node N1, and a gate electrode of the second transistor M2 is coupled to a scan line Si. When a scan signal is supplied to the scan line Si, the second transistor M2 is turned on to electrically couple the first electrode of the first transistor M1 to the first node N1.

The third transistor M3 is coupled between the second electrode of the first transistor M1 and the reference power source Vref, and a gate electrode of the third transistor M3 is coupled to the scan line Si. When the scan signal is supplied to the scan line Si, the third transistor M3 is turned on to supply the voltage of the reference power source Vref to the second electrode of the first transistor M1. The voltage of the reference power source Vref is set to a voltage lower than that of the first driving power source ELVDD.

The fourth transistor M4 is coupled between the anode electrode of the OLED and the data line Dm, and a gate electrode of the fourth transistor M4 is coupled to the scan line Si. When the scan signal is supplied to the scan line Si, the fourth transistor M4 is turned on to electrically couple the anode electrode of the OLED to data line Dm.

The fifth transistor M5 is coupled between the second electrode of the first transistor M1 and the anode of the OLED, and a gate electrode of the fifth transistor M5 is coupled to a first emission control line E1i. The fifth transistor M5 is turned off when a first emission control signal is supplied to the first emission control line E1i, and is turned on in other cases.

The sixth transistor M6 is coupled between the first driving power source ELVDD and the first electrode of the first transistor M1, and a gate electrode of the sixth transistor M6 is coupled to a second emission control line E2i. The sixth transistor M6 is turned off when the second emission control signal is supplied to the second emission control line E2i, and is turned on in other cases.

The storage capacitor Cst is coupled between the first node N1 and the anode electrode of the OLED. The storage capacitor Cst stores a voltage corresponding to both the data signal and the threshold voltage of the first transistor M1.

Figure 3:
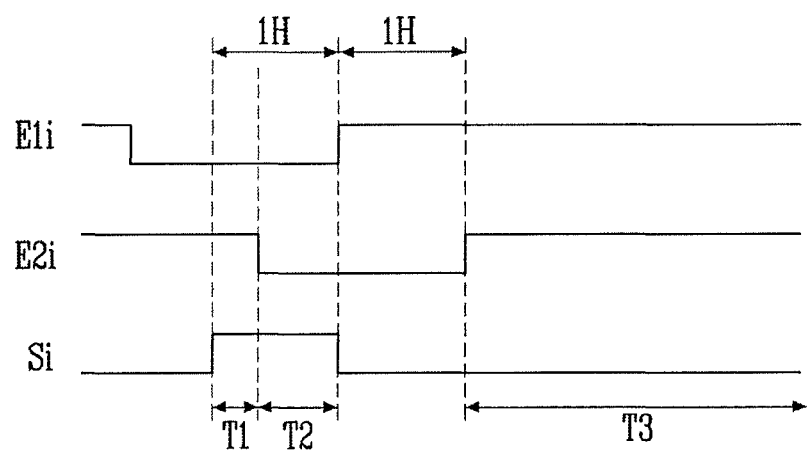
FIG. 3 illustrates an embodiment of a method for driving a pixel.

FIG. 3 illustrates an embodiment of a method for driving the pixel in FIG. 2. In this embodiment, the pixel is driven in a first period T1, a second period T2, and a third period T3. During the first period T1, the first node N1 is initialized to the voltage of the first driving power source ELVDD. During the second period T2, a voltage corresponding to both the data signal and the threshold voltage of the first transistor M1 is stored in the storage capacitor Cst. During the third period T3, a predetermined current is supplied from the first transistor M1 to the OLED based on the voltage of the first node N1. The OLED generates light having predetermined luminance depending on the amount of current supplied from the first transistor M1.

Figure 4A:
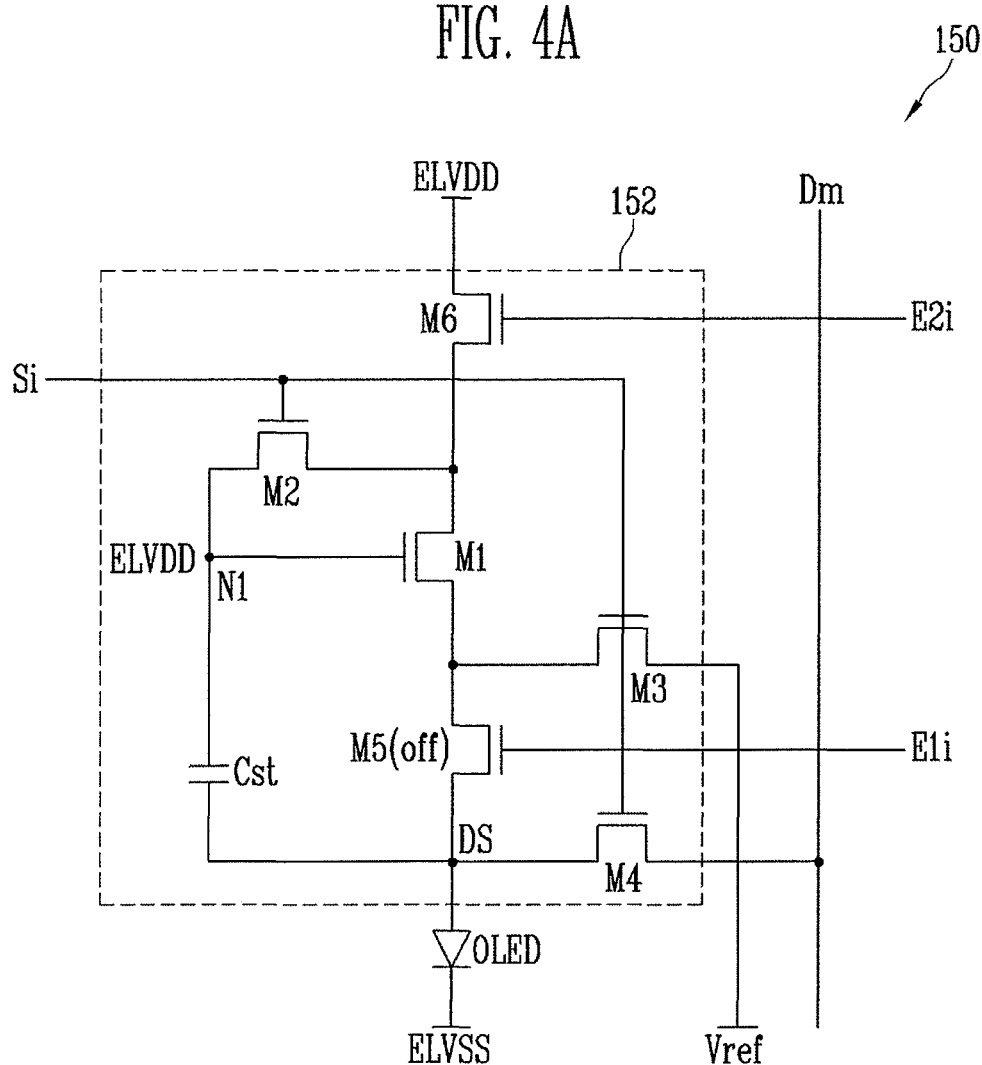
FIGS. 4A to 4C illustrate embodiments of signals for controlling a pixel.
Figure 4A:
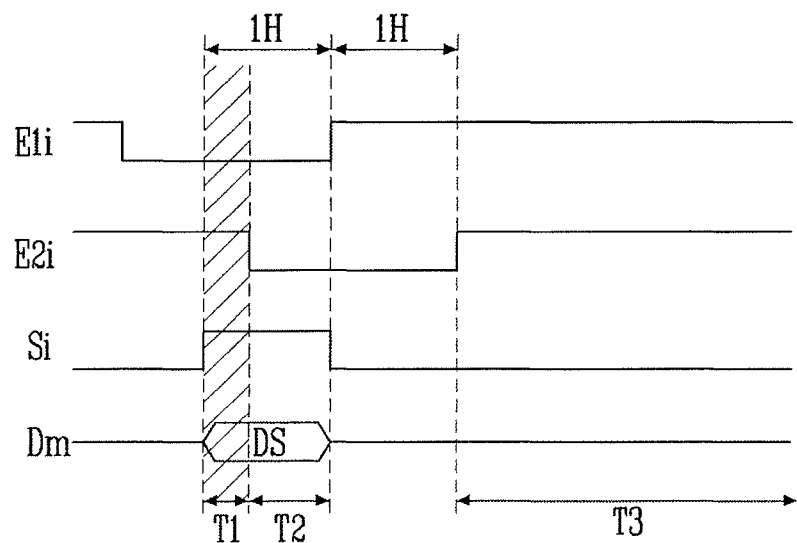
Figure 4B:
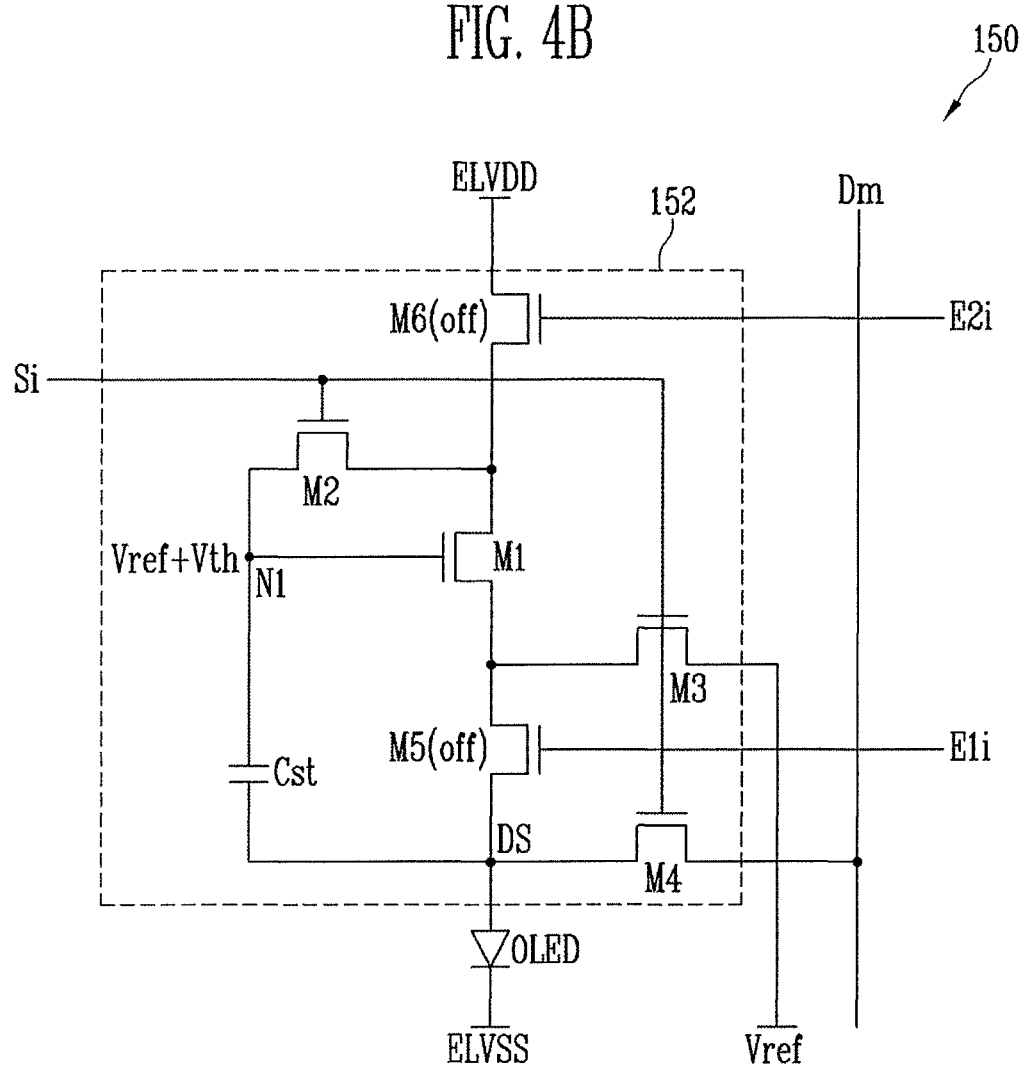
Figure 4B:
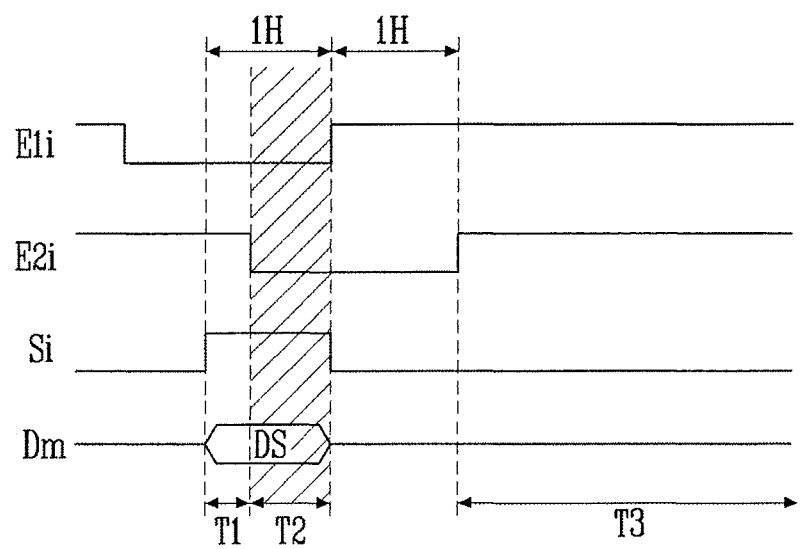
Figure 4C:
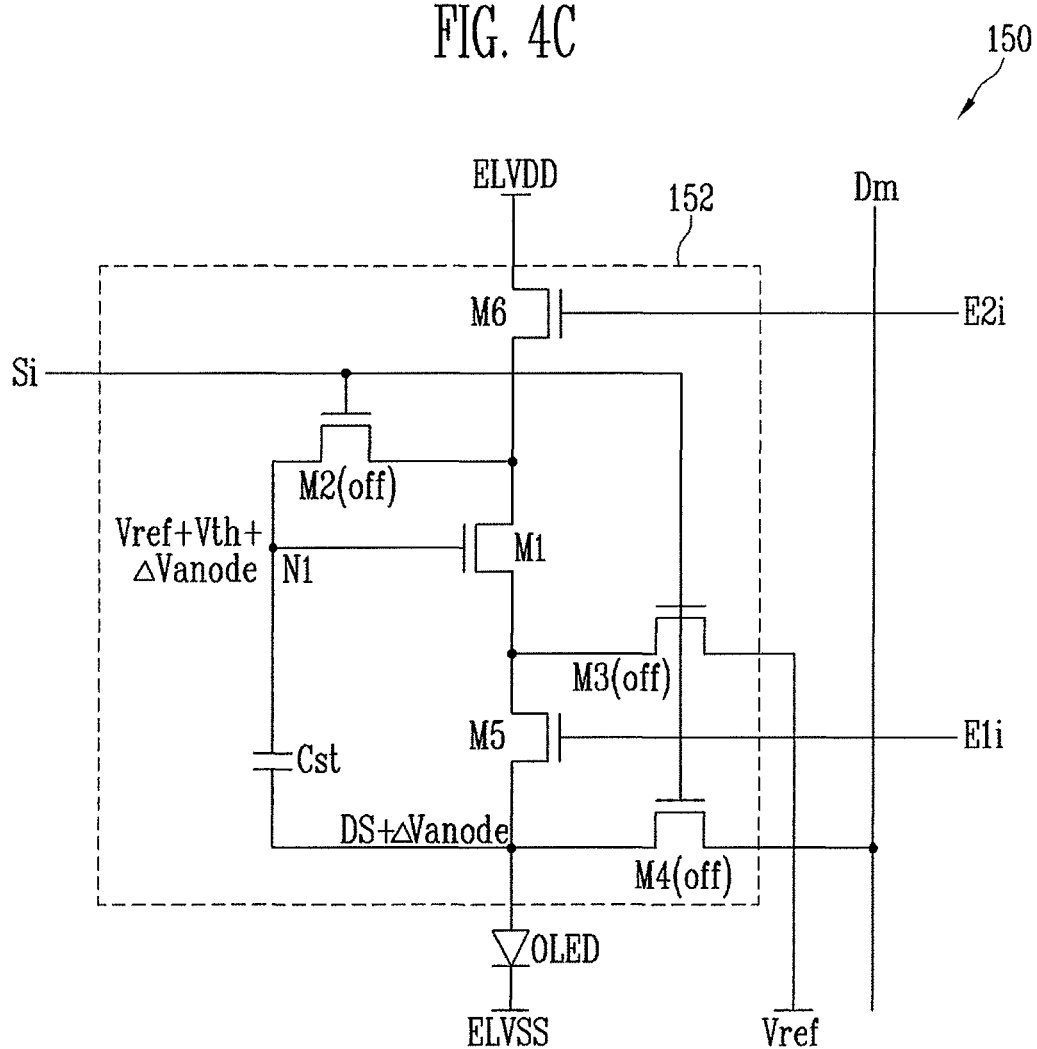
Figure 4C:
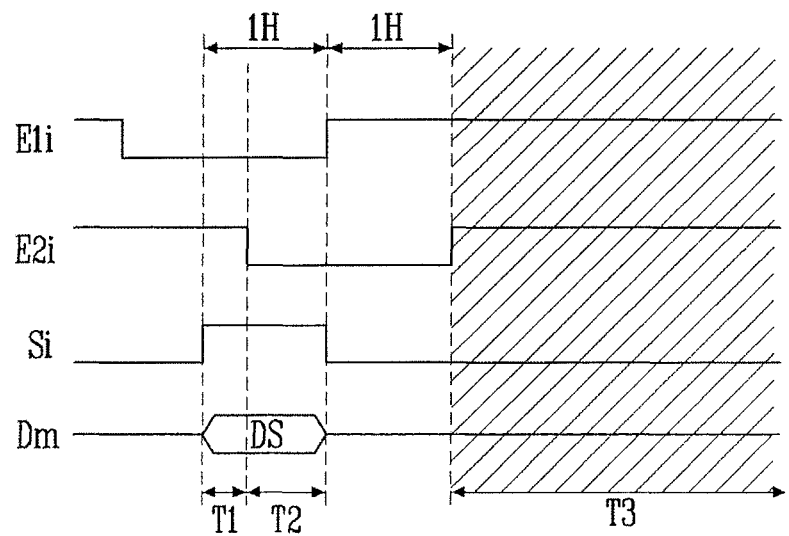

FIGS. 4A to 4C illustrates an embodiment of signals for controlling the pixel in FIG. 2 based on the driving method of FIG. 3. Referring to FIG. 4A, a first emission control signal is supplied to the first emission control line E1i and a scan signal is supplied to the scan line Si during the first period T1.

When the first emission control signal is supplied to the first emission control line E1i, the fifth transistor M5 is turned off. When the fifth transistor M5 is turned off, the second electrode of the first transistor M1 is electrically disconnected from the anode electrode of the OLED.

When a scan signal is supplied to the scan line Si, the second transistor M2, the third transistor M3, and the fourth transistor M4 are turned on. When the second transistor M2 is turned on, the first electrode of the first transistor M1 is electrically coupled to the first node N1. Then, the first node N1 is initialized to the voltage of the first driving power source ELVDD.

When the third transistor M3 is turned on, the voltage of the reference power source Vref is supplied to the second electrode of the first transistor M1.

When the fourth transistor M4 is turned on, the data line Dm is electrically coupled to the anode electrode of the OLED. Then, a data signal DS from the data line Dm is supplied to the anode electrode of the OLED. The voltage of the second driving power source ELVSS is set to a voltage higher than that of the data signal DS. Thus, the OLED is maintained in a non-luminous state.

Referring to FIG. 4B, a second emission control signal is supplied to the second emission control line E2i during the second period T2. Further, during the second period T2, the supply of the scan signal to the scan line Si is maintained.

When the second emission control signal is supplied to the second emission control line E2i, the sixth transistor M6 is turned off. When the sixth transistor M6 is turned off, the first driving power source ELVDD is electrically disconnected from the first electrode of the first transistor M1.

Further, during the second period T2, the second transistor M2 to the fourth transistor M4 remain turned on based on the scan signal supplied to the scan line Si.

When the third transistor M3 is turned on, the voltage of the reference power source Vref is supplied to the second electrode of the first transistor M1.

When the second transistor M2 is turned on, the first transistor M1 is coupled in the form of a diode. Since the second electrode of the first transistor M1 is set to the voltage of the reference power source Vref, the voltage of the first node N1 is set to a voltage which corresponds to the sum of the voltage of the reference power source Vref and the threshold voltage Vth of the first transistor M1 (for example, Vref+Vth).

When the fourth transistor M4 is turned on, the anode electrode of the OLED is maintained at the voltage of the data signal DS. The storage capacitor Cst stores a voltage between the first node N1 and the anode electrode of the OLED.

The voltage of the reference power source Vref is set to a constant DC voltage. Thus, the voltage stored in the storage capacitor Cst is set to correspond to the data signal Ds and the threshold voltage Vth of the first transistor M1. Thus, during the second period T2, the storage capacitor Cst stores the voltage corresponding to both the data signal DS and the threshold voltage Vth of the first transistor M1.

Referring to FIG. 4C, during the third period T3, supply of the first emission control signal to the first emission control line E1i is stopped and supply of the second emission control signal to the second emission control line E2i is stopped. Further, during the third period T3, the supply of the scan signal to the scan line Si is stopped.

When the supply of the scan signal to the scan line Si is stopped, the second transistor M2 to the fourth transistor M4 are turned off.

When the supply of the first emission control signal to the first emission control line E1i is stopped, the fifth transistor M5 is turned on. When the fifth transistor M5 is turned on, the second electrode of the first transistor M1 is electrically coupled to the anode electrode of the OLED.

When the supply of the second emission control signal to the second emission control line E2i is stopped, the sixth transistor M6 is turned on. When the sixth transistor M6 is turned on, the voltage of the first driving power source ELVDD is supplied to the first electrode of the first transistor M1.

For example, during the third period T3, a current path leading from the first driving power source ELVDD to the sixth transistor M6, the first transistor M1, the fifth transistor M5, the OLED, and the second driving power source ELVSS is set. The first transistor M1 controls the amount of current supplied from the first driving power source ELVDD to the OLED based on the voltage of the first node N1. Then, during the third period T3, the OLED generates light having predetermined luminance depending on the amount of current from the first transistor M1.

When the current is supplied to the OLED, the voltage of the anode electrode of the OLED is changed by ΔVanode based on the amount of current supplied from the first transistor M1 and the voltage of the second driving power source ELVSS. The voltage of the first node N1 also changes by ΔVanode due to the coupling of the storage capacitor Cst. Thus, in the present embodiment, the gate-source voltage Vgs of the first transistor M1 may remain constant regardless of voltage drop of the second driving power source ELVSS. As a result, an image with a desired luminance may be displayed.

During the third period T3 in which the OLED emits light, the second transistor M2 to the fourth transistor M4 remains turned off. In order to secure reliability of driving of the pixel 150, the second transistor M2 to the fourth transistor M4 should stably remain turned off during the third period T3.

When leakage current occurs in at least one of the second to fourth transistors M2 to M4, an image having desired luminance cannot be displayed by the pixel 150. In particular, when the pixel 150 is driven at low frequency, the voltage of the first node N1 is changed due to the leakage current of the second transistor M2. Thus, the luminance of the pixel 150 may rapidly change. In one embodiment, at least one of the second to fourth transistors M2 to M4 may be implemented as an oxide semiconductor transistor. As a result, an image with a desired luminance may be displayed.

Figure 5:
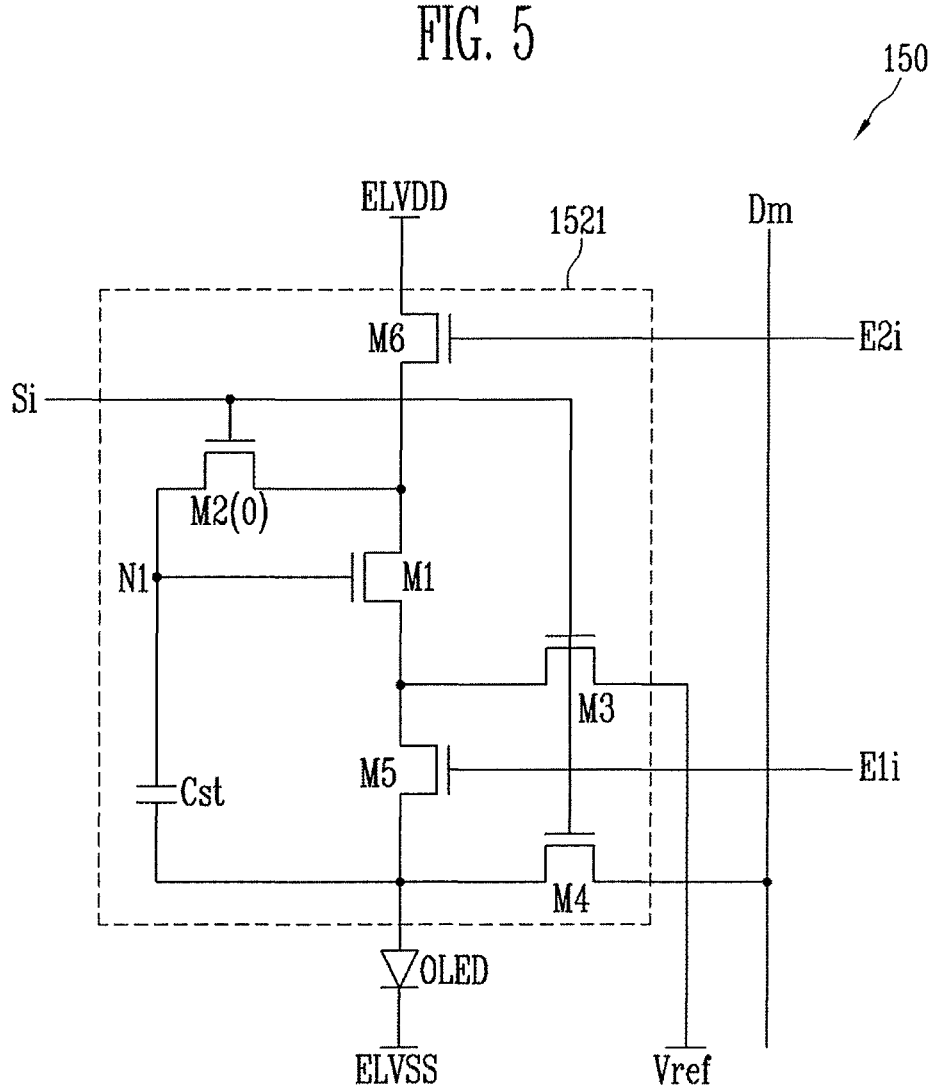
FIG. 5 illustrates another embodiment of a pixel.

FIG. 5 illustrates another embodiment of a pixel 150 which may include an oxide semiconductor transistor and a polysilicon semiconductor transistor.

The oxide semiconductor transistor includes a gate electrode, a source electrode, a drain electrode, and an active layer made of an oxide semiconductor. The oxide semiconductor may be set to an amorphous or crystalline material. The oxide semiconductor transistor may be an N-type transistor. The oxide semiconductor transistor may enable a low-temperature process and may have charge mobility lower than that of a polysilicon semiconductor transistor. Such an oxide semiconductor transistor has excellent off-current characteristics.

The polysilicon semiconductor transistor includes a gate electrode, a source electrode, a drain electrode, and an active layer made of polysilicon. The polysilicon semiconductor transistor may be set, for example, to a low-temperature polysilicon (LTPS) transistor. Such a polysilicon semiconductor transistor may be P-type or N-type transistor. In the present embodiment, the polysilicon semiconductor transistor is an N-type transistor with high electron mobility and with fast driving characteristics.

The pixel 150 according to the present embodiment may include a pixel circuit 1521 and an organic light-emitting diode (OLED). The OLED has an anode electrode coupled to the pixel circuit 1521 and a cathode electrode coupled to the second driving power source ELVSS. The OLED generates light with a predetermined luminance depending on the amount of current supplied from the pixel circuit 1521.

The pixel circuit 1521 controls the amount of current that flows from the first driving power source ELVDD to the second driving power source ELVSS, via the OLED, based on a data signal. The pixel circuit 1521 may be like pixel circuit in FIG. 2, except for a second transistor M2(O).

The second transistor M2(O) is coupled between a first electrode of a first transistor M1 and the first node N1, and has a gate electrode coupled to a scan line Si. When a scan signal is supplied to the scan line Si, the second transistor M2(O) is turned on, to electrically couple the first electrode of the first transistor M1 to the first node N1.

The second transistor M2(O) may be an oxide semiconductor transistor. When the second transistor M2(O) is an oxide semiconductor transistor, a change that may occur in the voltage of the first node N1 due to leakage current may be reduced or minimized. Thus, an image with a desired luminance may be displayed.

Because the second transistor M2(O) has excellent off-current characteristics, the change in the voltage of the first node N1 may be reduced or minimized during the third period T3. In this case, even when the pixel 150 is driven at a low frequency, any change that may occur in the voltage of the first node N1 may be reduced or minimized. Thus, an image with desired luminance may be displayed. Except for the second transistor M2(O), the pixel of FIG. 5 may be the same as the pixel of FIG. 2.

Figure 6:
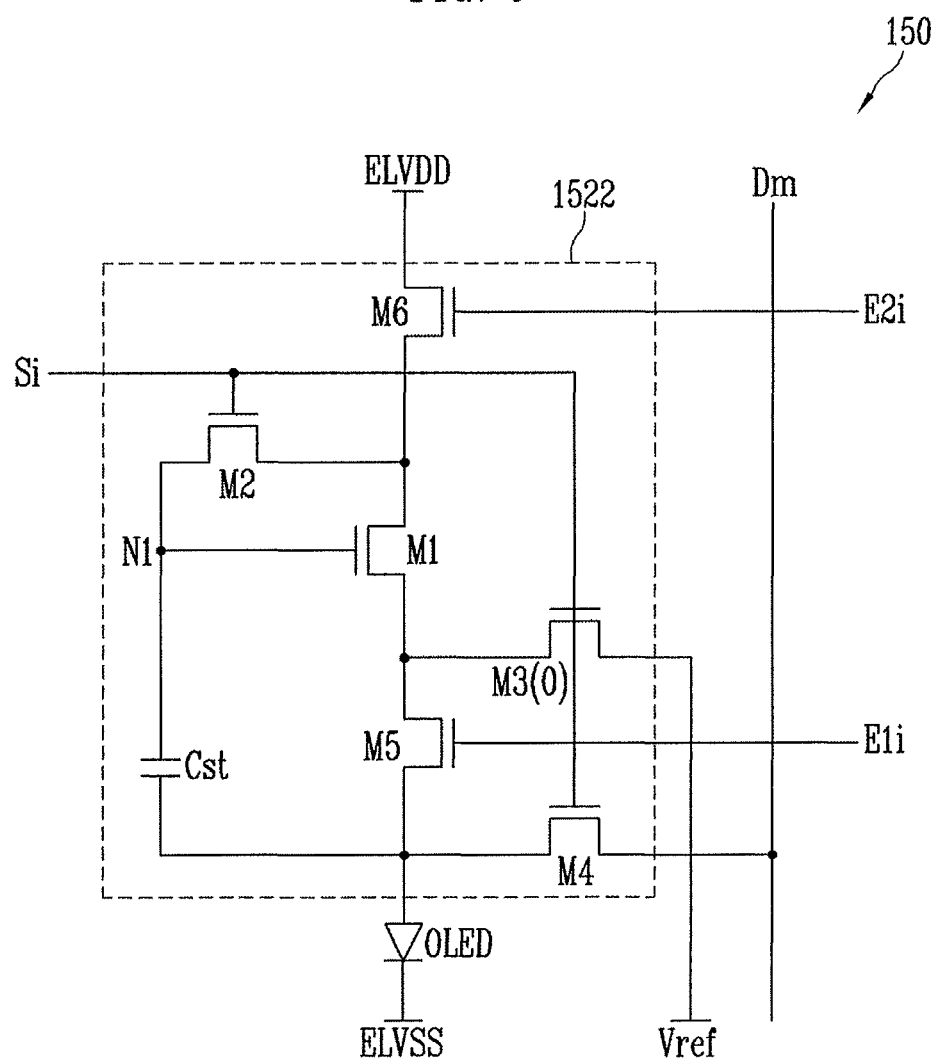
FIG. 6 illustrates another embodiment of a pixel.

FIG. 6 illustrates another embodiment of a pixel 150 which may include a pixel circuit 1522 and an organic light-emitting diode (OLED). An anode electrode of the OLED is coupled to the pixel circuit 1522, and a cathode electrode of the OLED is coupled to a second driving power source ELVSS. The OLED emits light with a predetermined luminance depending on the amount of current supplied from the pixel circuit 1522.

The pixel circuit 1522 controls the amount of current that flows from a first driving power source ELVDD to the second driving power source ELVSS, via the OLED, based on a data signal. The pixel circuit 1522 may be the same as the pixel in FIG. 2, except for a third transistor M3(O).

The third transistor M3(O) is coupled between a second electrode of a first transistor M1 and a reference power source Vref, and a gate electrode of the third transistor M3(O) is coupled to a scan line Si. When a scan signal is supplied to the scan line Si, the third transistor M3(O) is turned on to supply the voltage of the reference power source Vref to the second electrode of the first transistor M1.

The third transistor M3(O) may be an oxide semiconductor transistor. When the third transistor M3(O) is an oxide semiconductor transistor, any leakage current that may occur between the reference power source Vref and the second electrode of the first transistor M1 may be reduced or minimized. Thus, an image with a desired luminance may be displayed.

Figure 7:
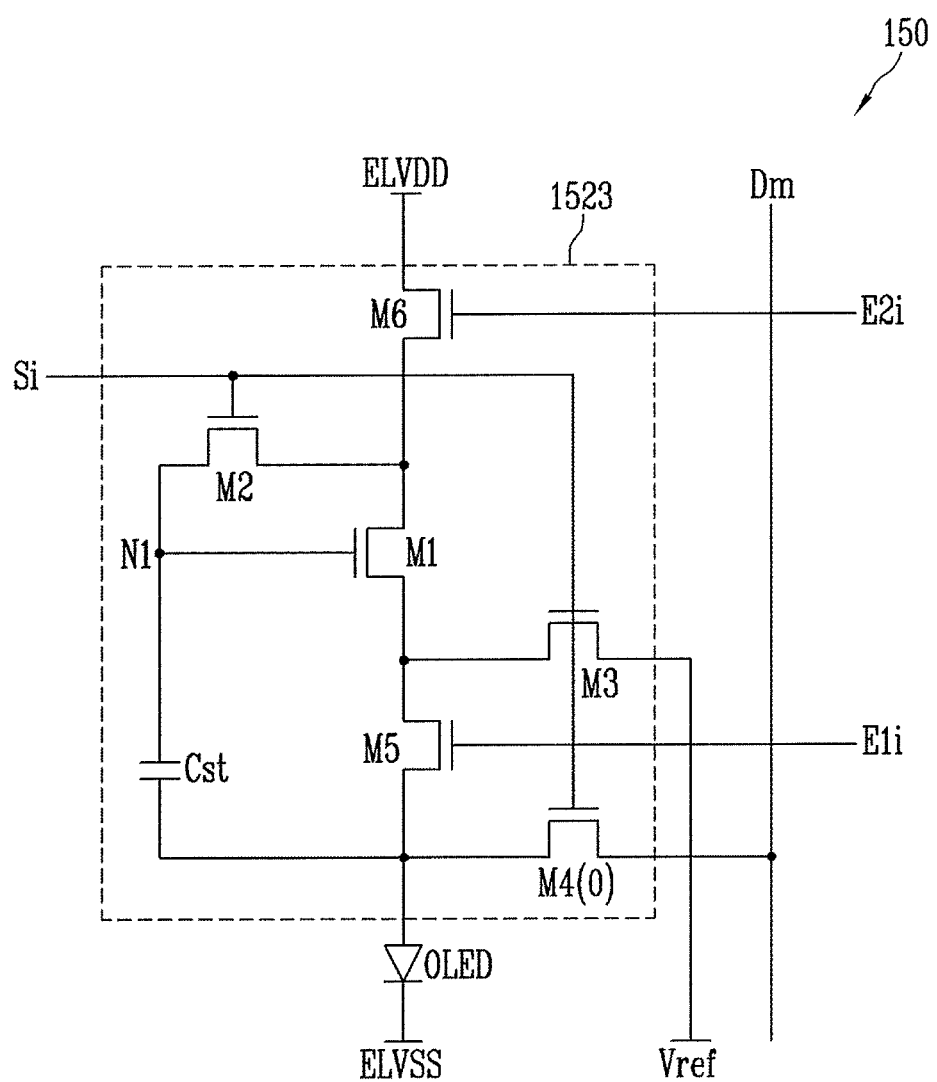
FIG. 7 illustrates another embodiment of a pixel.

FIG. 7 illustrates an embodiment of a pixel 150 which may include a pixel circuit 1523 and an organic light-emitting diode (OLED). An anode electrode of the OLED is coupled to the pixel circuit 1523, and a cathode electrode of the OLED is coupled to a second driving power source ELVSS. The OLED emits light with a predetermined luminance depending on the amount of current supplied from the pixel circuit 1523.

The pixel circuit 1523 controls the amount of current that flows from a first driving power source ELVDD to the second driving power source ELVSS, via the OLED, based on a data signal. The pixel circuit 1523 may be the same as the pixel of FIG. 2, except for a fourth transistor M4(O).

The fourth transistor M4(O) is coupled between the anode electrode of the OLED and a data line Dm, and a gate electrode of the fourth transistor M4(O) is coupled to a scan line Si. When a scan signal is supplied to the scan line Si, the fourth transistor M4(O) is turned on to electrically couples the anode electrode of the OLED to the data line Dm.

The fourth transistor M4(O) is an oxide semiconductor transistor. When the fourth transistor M4(O) is an oxide semiconductor transistor, any leakage current that may occur between the data line Dm and the anode electrode of the OLED may be reduced or minimized. Thus, an image with a desired luminance may be displayed.

Figure 8:
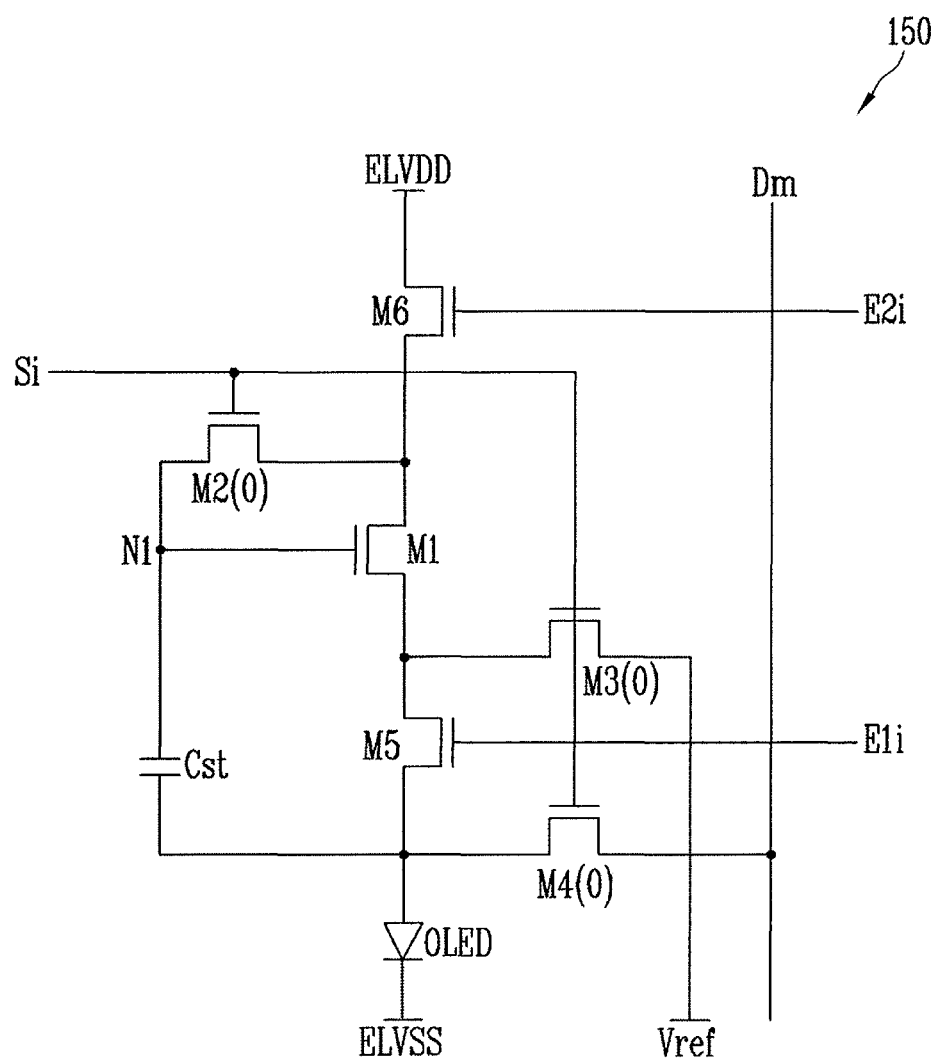
FIG. 8 illustrates another embodiment of a pixel.

At least one of the second to fourth transistors M2 to M4 may be an oxide semiconductor transistors in FIGS. 5 to 7. In one embodiment, for example, as illustrated in FIG. 8, all of second to fourth transistors M2(O) to M4(O) may be oxide semiconductor transistors.

When the second to fourth transistors M2(O) to M4(O) are oxide semiconductor transistors, any current leaking from a current path during the light-emitting third period T3 may be reduced or minimized. Thus, an image with a desired luminance may be displayed. In particular, when the second to fourth transistors M2(O) to M4(O) are oxide semiconductor transistors, an image with a desired luminance may be stably displayed, even when the pixel 150 is driven at a low frequency.

Figure 9:
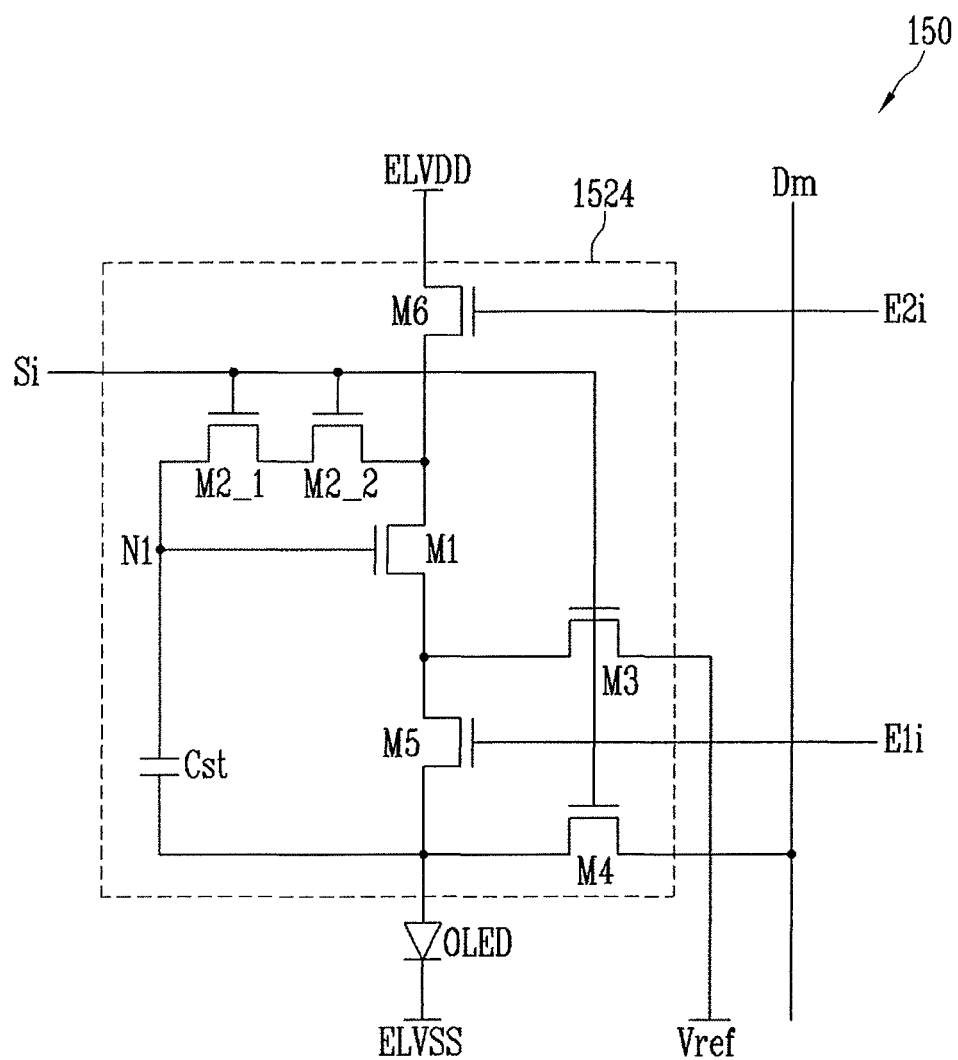
FIG. 9 illustrates another embodiment of a pixel.

FIG. 9 illustrates an embodiment of a pixel 150 which may include a pixel circuit 1524 and an organic light-emitting diode (OLED). An anode electrode of the OLED is coupled to the pixel circuit 1524, and a cathode electrode of the OLED is coupled to a second driving power source ELVSS. The OLED emits light having predetermined luminance depending on the amount of current supplied from the pixel circuit 1524.

The pixel circuit 1524 controls the amount of current that flows from a first driving power source ELVDD to the second driving power source ELVSS, via the OLED, based on a data signal. The pixel circuit 1524 is may be the same as the pixel of FIG. 2, except for second transistors M2_1 and M2_2.

The second transistor M2 is implemented using a plurality of transistors (e.g. M2_1 and M2_2) connected in series between a first node N1 and a first electrode of a first transistor M1. The second transistors M2_1 and M2_2 may be a dual-gate transistor structure. The gate electrodes of the second transistors M2_1 and M2_2 are coupled to a scan line Si. When a scan signal is supplied to the scan line Si, the second transistors M2_1 and M2_2 are turned on to electrically couple the first node N1 to the first electrode of the first transistor M1.

When the transistors M2_1 and M2_2 are connected in series to each other to form the second transistor M2, any change in the voltage of the first node N1 that may occur due to leakage current may be reduced or minimized. When the change in voltage of the first node N1 is reduced or minimized, an image with a desired luminance may be displayed when the pixel 150 is driven at a low frequency.

Figure 10:
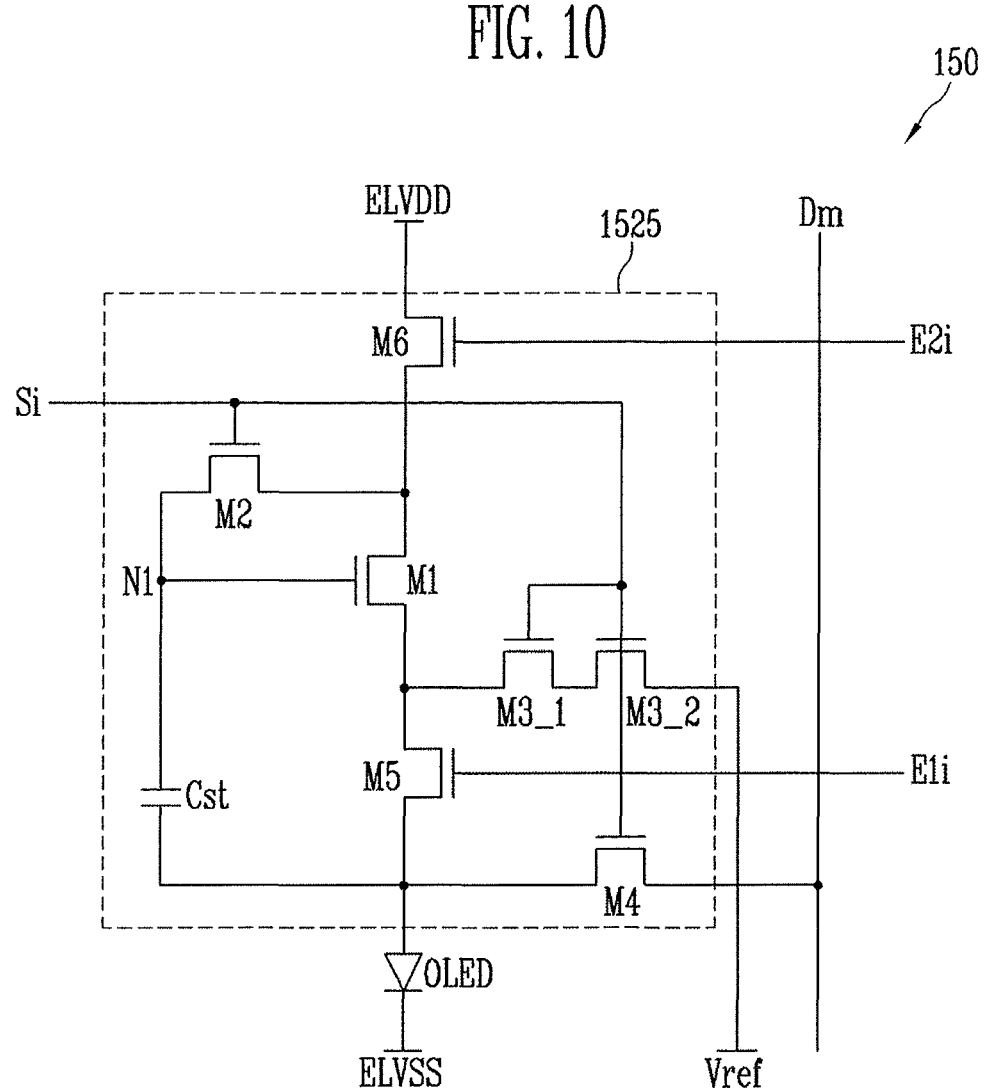
FIG. 10 illustrates another embodiment of a pixel.

FIG. 10 illustrates an embodiment of a pixel 150 which may include a pixel circuit 1525 and an organic light-emitting diode (OLED). An anode electrode of the OLED is coupled to the pixel circuit 1525, and a cathode electrode of the OLED is coupled to a second driving power source ELVSS. The OLED emits light with a predetermined luminance depending on the amount of current supplied from the pixel circuit 1525.

The pixel circuit 1525 controls the amount of current that flows from a first driving power source ELVDD to the second driving power source ELVSS, via the OLED, based on a data signal. The pixel circuit 1525 may be the same as the pixel circuit in FIG. 2, except for third transistors M3_1 and M3_2.

The third transistor M3 is implemented using a plurality of transistors (e.g. M3_1 and M3_2) connected in series between a second electrode of the first transistor M1 and a reference power source Vref. The third transistors M3_1 and M3_2 may be implemented with a dual-gate transistor structure, and gate electrodes of the third transistors M3_1 and M3_2 are coupled to a scan line Si. When a scan signal is supplied to the scan line Si, the third transistors M3_1 and M3_2 are turned on to supply the voltage of the reference power source Vref to the second electrode of first transistor M1.

When the transistors M3_1 and M3_2 are connected in series to each other to form the third transistor M3, any leakage current that may occur between the reference power source Vref and the second electrode of the first transistor M1 may be reduced or minimized. Thus, an image with a desired luminance may be displayed.

Figure 11:
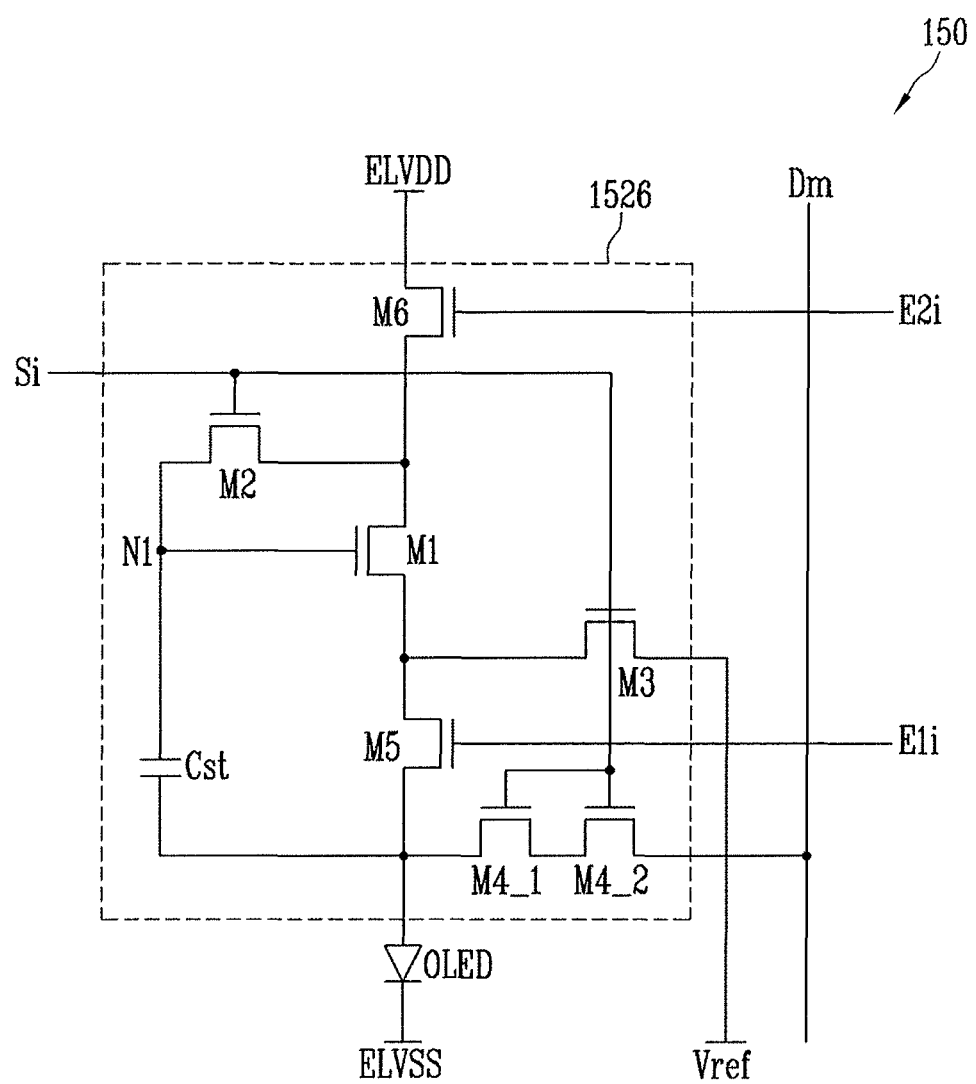
FIG. 11 illustrates another embodiment of a pixel.

FIG. 11 illustrates another embodiment of a pixel 150 which may include a pixel circuit 1526 and an organic light-emitting diode (OLED). An anode electrode of the OLED is coupled to the pixel circuit 1526, and a cathode electrode of the OLED is coupled to a second driving power source ELVSS. The OLED emits light with a predetermined luminance depending on the amount of current supplied from the pixel circuit 1526.

The pixel circuit 1526 controls the amount of current that flows from a first driving power source ELVDD to the second driving power source ELVSS, via the OLED, based on a data signal. The pixel circuit 1526 may be the same as the pixel circuit in FIG. 2, except for fourth transistors M4_1 and M4_2.

The fourth transistor M4 is implemented using a plurality of transistors (e.g. M4_1 and M4_2) connected in series between the anode electrode of the OLED and a data line Dm. The fourth transistors M4_1 and M4_2 may be implemented, for example, as a dual-gate transistor structure. The gate electrodes of the fourth transistors M4_1 and M4_2 are coupled to a scan line Si. When a scan signal is supplied, the fourth transistors M4_1 and M4_2 are turned on to electrically couple the anode electrode of the OLED to the data line Dm.

When the transistors M4_1 and M4_2 are connected in series to each other to form the fourth transistor M4, any leakage current that may occur between the data line Dm and the anode electrode of the OLED may be reduced or minimized. Thus, an image with a desired luminance may be displayed.

Figure 12:
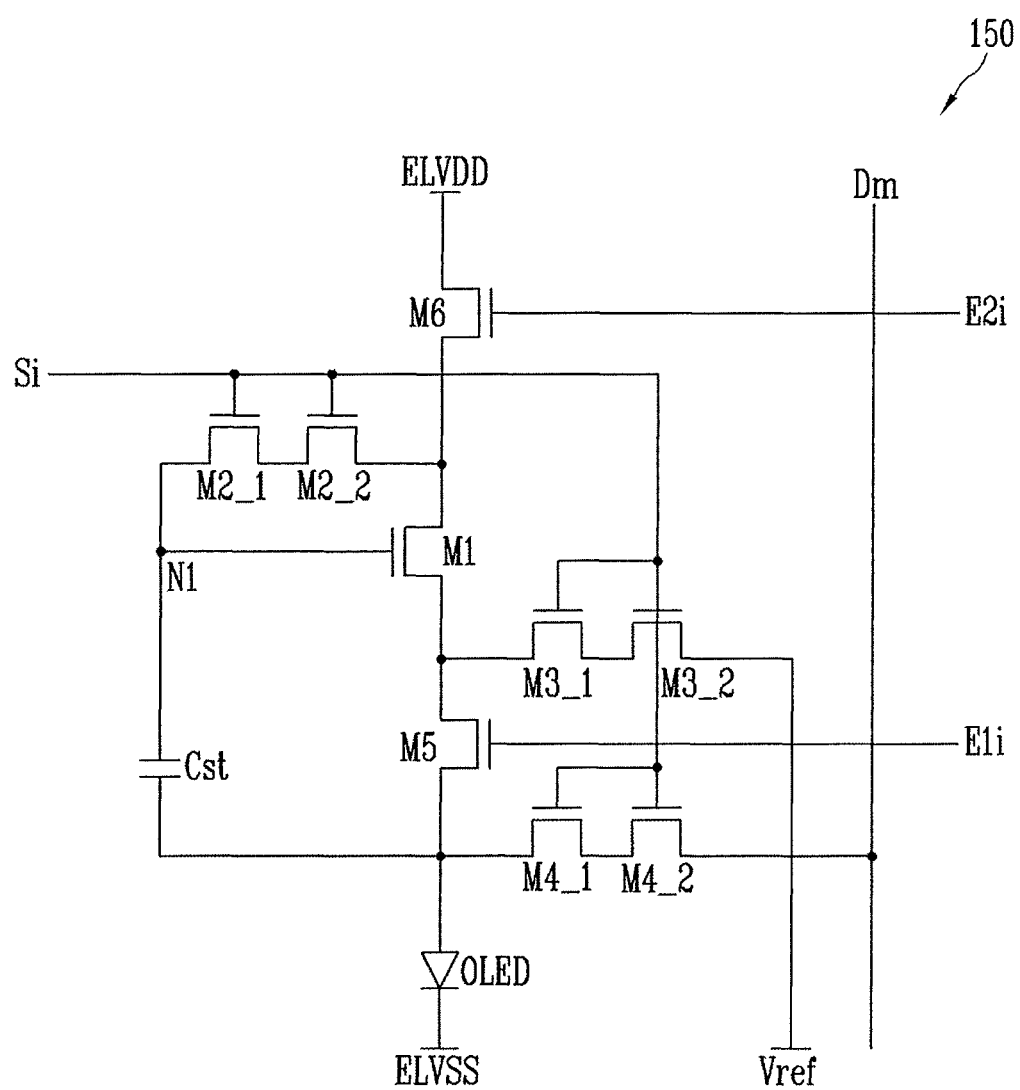
FIG. 12 illustrates another embodiment of a pixel.

Any one of the second to fourth transistors M2 to M4 are implemented as a dual-gate transistor structure. In one embodiment, at least one of the second to fourth transistors M2 to M4 may be implemented using a plurality of transistors. For example, as shown in FIG. 12, the second, third, and fourth transistors may be implemented using a plurality of second transistors M2_1 and M2_2, a plurality of third transistors M3_1 and M3_2, and a plurality of fourth transistors M4_1 and M4_2, respectively.

When the second, third, and fourth transistors may be implemented using the second transistors M2_1 and M2_2, third transistors M3_1 and M3_2, and fourth transistors M4_1 and M4_2, respectively, any current leaking from a current path during a third period T3 in which the OLED emits light may be reduced or minimized. Thus, enabling an image with a desired luminance to be displayed. In particular, when the second, third, and fourth transistors are implemented using the second transistors M2_1 and M2_2, third transistors M3_1 and M3_2, and fourth transistors M4_1 and M4_2, respectively, an image with a desired luminance may be stably displayed even when the pixel 150 is driven at a low frequency.

Figure 13:
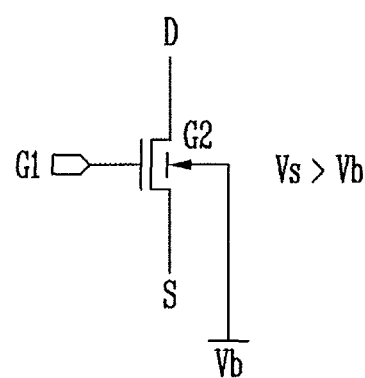
FIG. 13 illustrates an example of characteristics of a pixel transistor.
Figure 13:
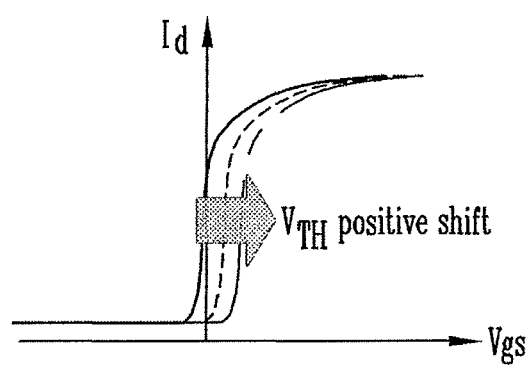

FIG. 13 illustrates an example of the characteristics of a transistor to be applied to a pixel according to the present disclosure. Referring to FIG. 13, a transistor may include a drain electrode D, a source electrode S, and two gate electrodes G1 and G2. Because the transistor has two gate electrodes, it may be referred to as a "double-gate transistor".

The double-gate transistor is formed such that the first gate electrode G1 and the second gate electrode G2 are disposed opposite each other with an insulating layer interposed therebetween. For example, a double-gate transistor disclosed in Korean Patent Application No. 2010-0043503 was filed by the present applicant.

The double-gate transistor has characteristics of a threshold voltage Vth being shifted in accordance with a voltage that is supplied to the second gate electrode G2. In detail, when the voltage of bias power Vb supplied to the second gate electrode G2 is lower than a voltage Vs supplied to the source electrode S, the threshold voltage of the transistor is positively shifted. Further, when the voltage of bias power Vb supplied to the second gate electrode G2 is higher than the voltage Vs supplied to the source electrode S, the threshold voltage of the transistor is negatively shifted. Furthermore, when the same voltage is applied both to the first gate electrode G1 and to the second gate electrode G2, mobility is improved. The voltages that are supplied to the drain electrode D, the source electrode S, and the first gate electrode G1 of the double-gate transistor are set to voltages identical to those of transistors that are generally used.

Meanwhile, in an embodiment of the present disclosure, at least one of the second to fourth transistors M2 to M4 illustrated in FIG. 2 may be implemented as a double-gate transistor so that the reliability of the pixel 150 is improved.

Figure 14A:
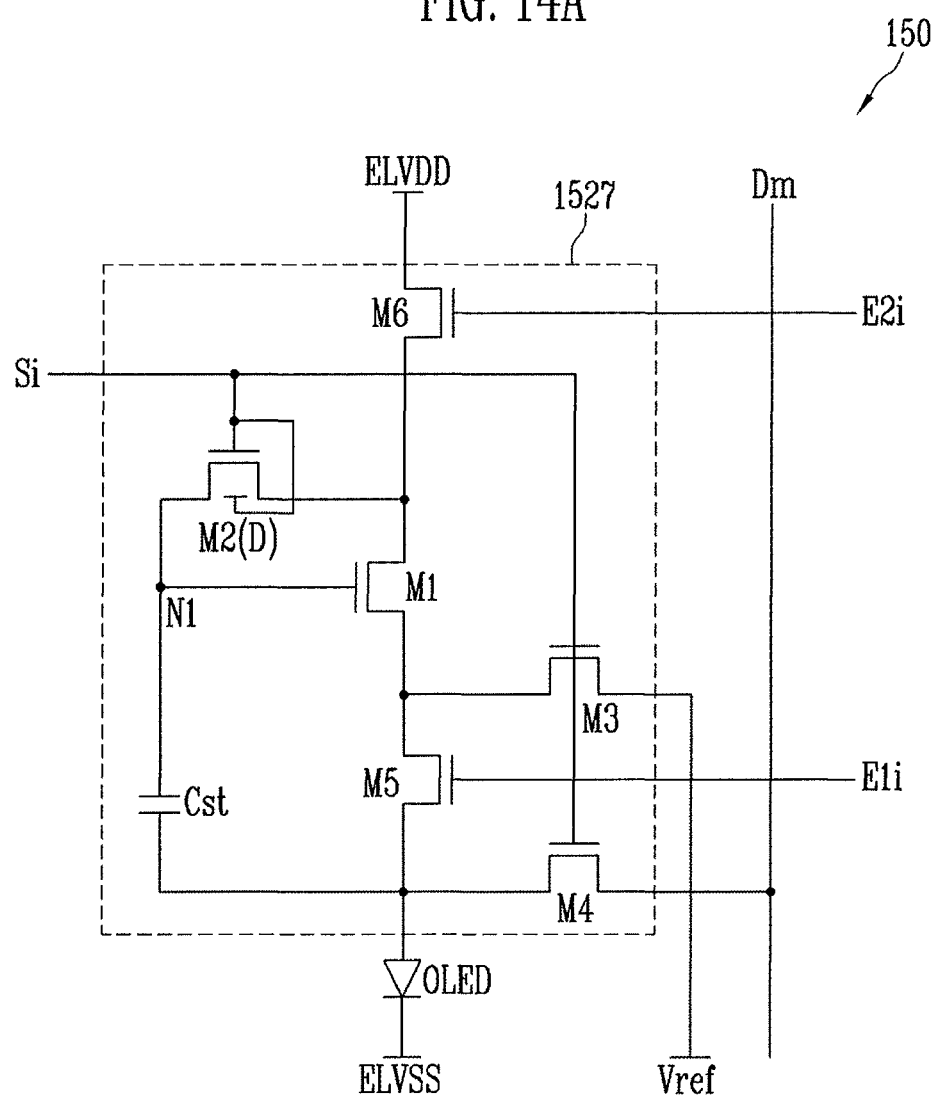
FIGS. 14A and 14B illustrate another embodiment of a pixel.
Figure 14B:
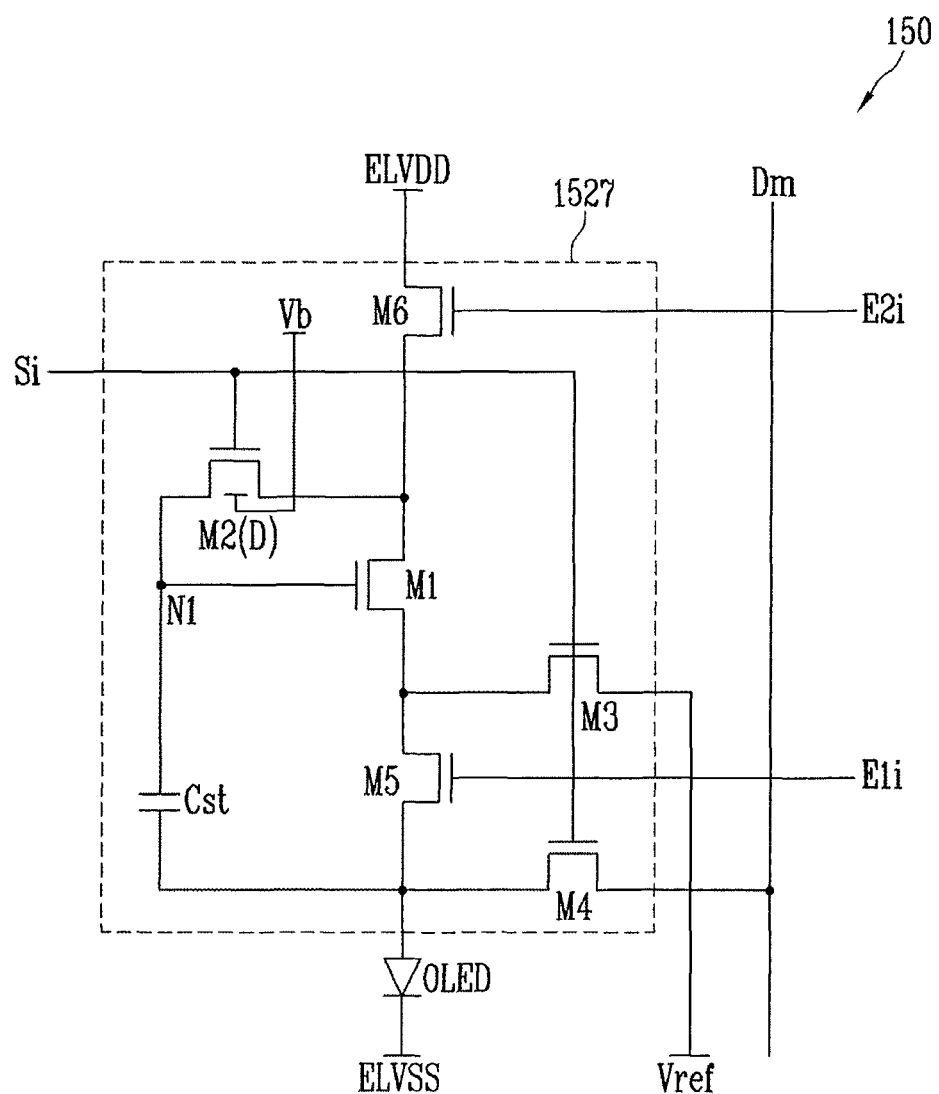

FIGS. 14A and 14B are diagrams illustrating a pixel according to an embodiment of the present disclosure.

Referring to FIG. 14A, a pixel 150 according to an embodiment of the present disclosure may include a pixel circuit 1527 and an organic light-emitting diode (OLED).

An anode electrode of the OLED is coupled to the pixel circuit 1527, and a cathode electrode of the OLED is coupled to a second driving power source ELVSS. Such an OLED generates light having predetermined luminance depending on the amount of current supplied from the pixel circuit 1527.

The pixel circuit 1527 controls the amount of current that flows from a first driving power source ELVDD into the second driving power source ELVSS via the OLED based on a data signal. The configuration of the pixel circuit 1527 is substantially identical to that of the pixel of FIG. 2 except for a second transistor M2(D).

The second transistor M2(D) is coupled between a first electrode of a first transistor M1 and a first node N1. Further, the first gate electrode G1 and the second gate electrode G2 of the second transistor M2(D) are coupled to a scan line Si. That is, the second transistor M2(D) is set to a double-gate transistor, and the first gate electrode G1 and the second gate electrode G2 thereof are coupled to the scan line Si. In this case, the mobility of the second transistor M2(D) may be improved, and thus the reliability of operation may be secured.

Additionally, the second gate electrode G2 of the second transistor M2(D) may be coupled to a bias power source Vb, as shown in FIG. 14B. Here, the voltage of the bias power source Vb may be changed at predetermined time intervals so that the threshold voltage of the second transistor M2(D) is maintained in an initial state. For example, the voltage of the bias power source Vb may be compared with a voltage that is supplied to the first gate electrode G1 and may then be periodically changed to have a high voltage or a low voltage so that the threshold voltage of the second transistor M2(D) is negatively or positively shifted. When the threshold voltage of the second transistor M2(D) is maintained in the initial state, the reliability of operation may be secured.

Figure 15A:
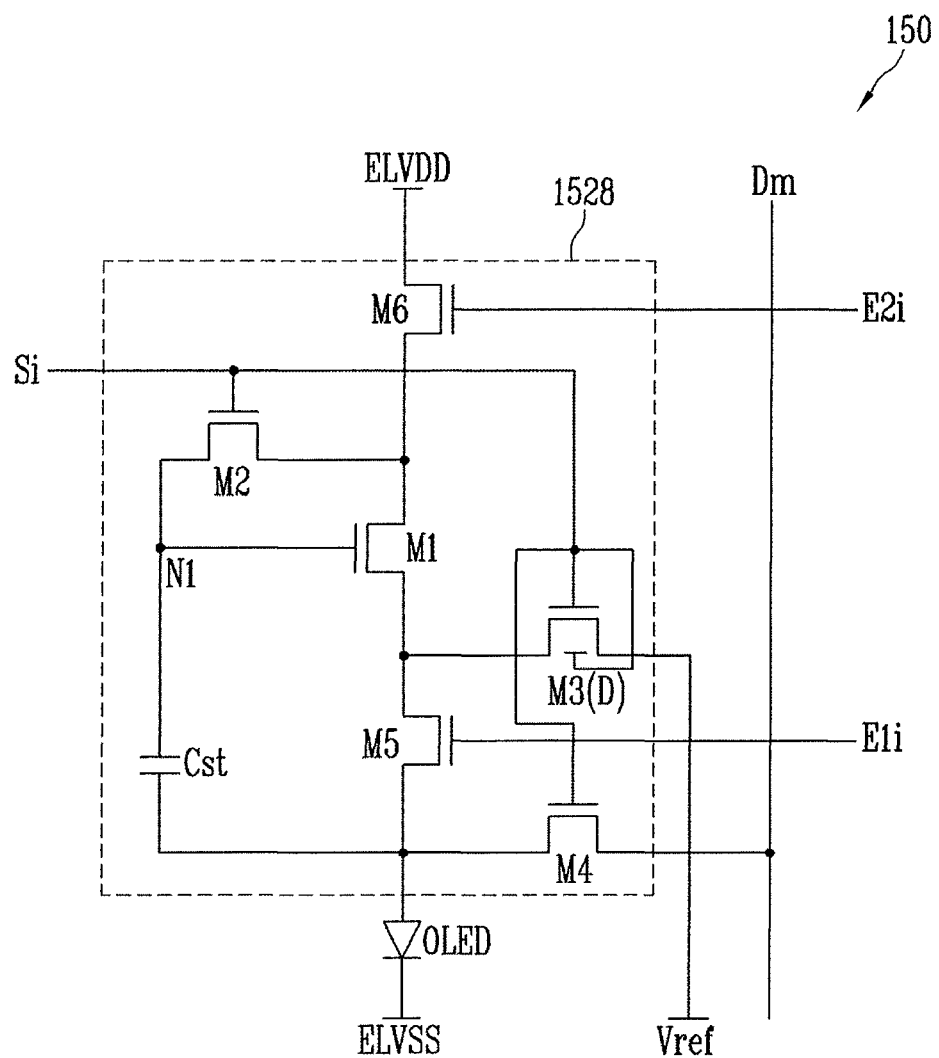
FIGS. 15A and 15B illustrate another embodiment of a pixel.
Figure 15B:
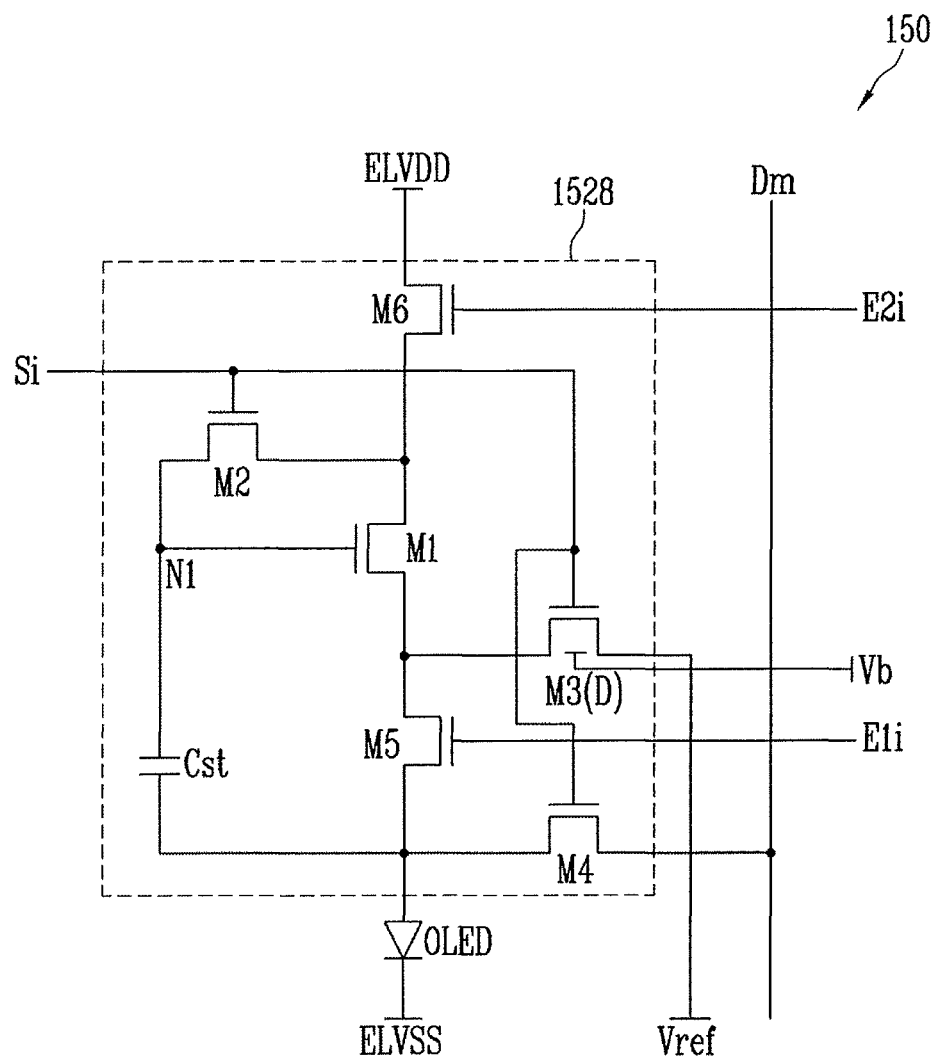

FIGS. 15A and 15B are diagrams illustrating a pixel according to an embodiment of the present disclosure.

Referring to FIG. 15A, a pixel 150 according to an embodiment of the present disclosure may include a pixel circuit 1528 and an organic light-emitting diode (OLED).

An anode electrode of the OLED is coupled to the pixel circuit 1528, and a cathode electrode of the OLED is coupled to a second driving power source ELVSS. Such an OLED generates light having predetermined luminance depending on the amount of current supplied from the pixel circuit 1528.

The pixel circuit 1528 controls the amount of current that flows from a first driving power source ELVDD into the second driving power source ELVSS via the OLED based on a data signal. The configuration of the pixel circuit 1528 is substantially identical to that of the pixel of FIG. 2 except for a third transistor M3(D).

The third transistor M3(D) is coupled between a second electrode of a first transistor M1 and a reference power source Vref. Further, the first gate electrode G1 and the second gate electrode G2 of the third transistor M3(D) are coupled to a scan line Si. That is, the third transistor M3(D) is set to a double-gate transistor, and the first gate electrode G1 and the second gate electrode G2 thereof are coupled to the scan line Si. In this case, the mobility of the third transistor M3(D) may be improved, and thus the reliability of operation may be secured.

Additionally, the second gate electrode G2 of the third transistor M3(D) may be coupled to a bias power source Vb, as illustrated in FIG. 15B. Here, the voltage of the bias power source Vb may be changed at predetermined time intervals so that the threshold voltage of the third transistor M3(D) is maintained in an initial state. For example, the voltage of the bias power source Vb may be compared with a voltage that is supplied to the gate electrode G1 and may then be periodically changed to have a high voltage or a low voltage so that the threshold voltage of the third transistor M3(D) is negatively or positively shifted. When the threshold voltage of the third transistor M3(D) is maintained in the initial state, the reliability of operation may be secured.

Figure 16A:
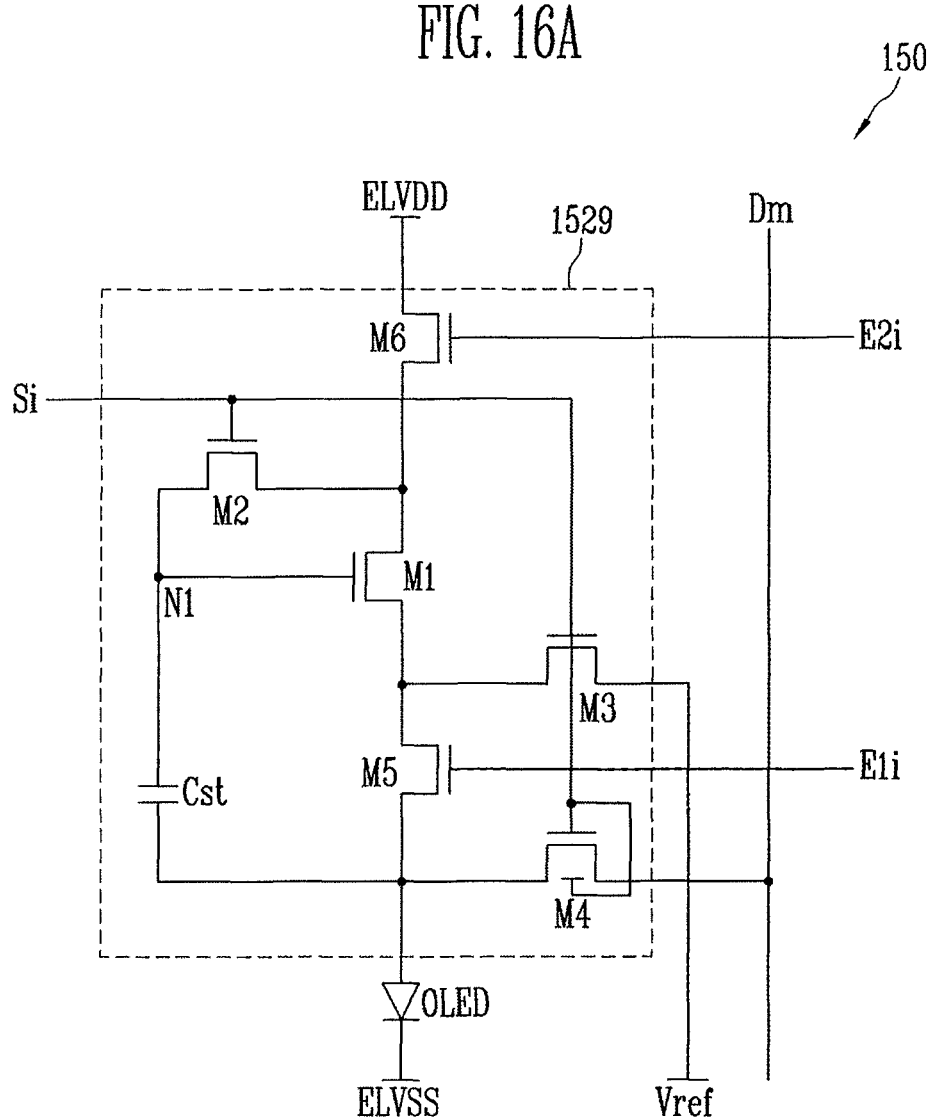
FIGS. 16A and 16B illustrate another embodiment of a pixel.
Figure 16B:
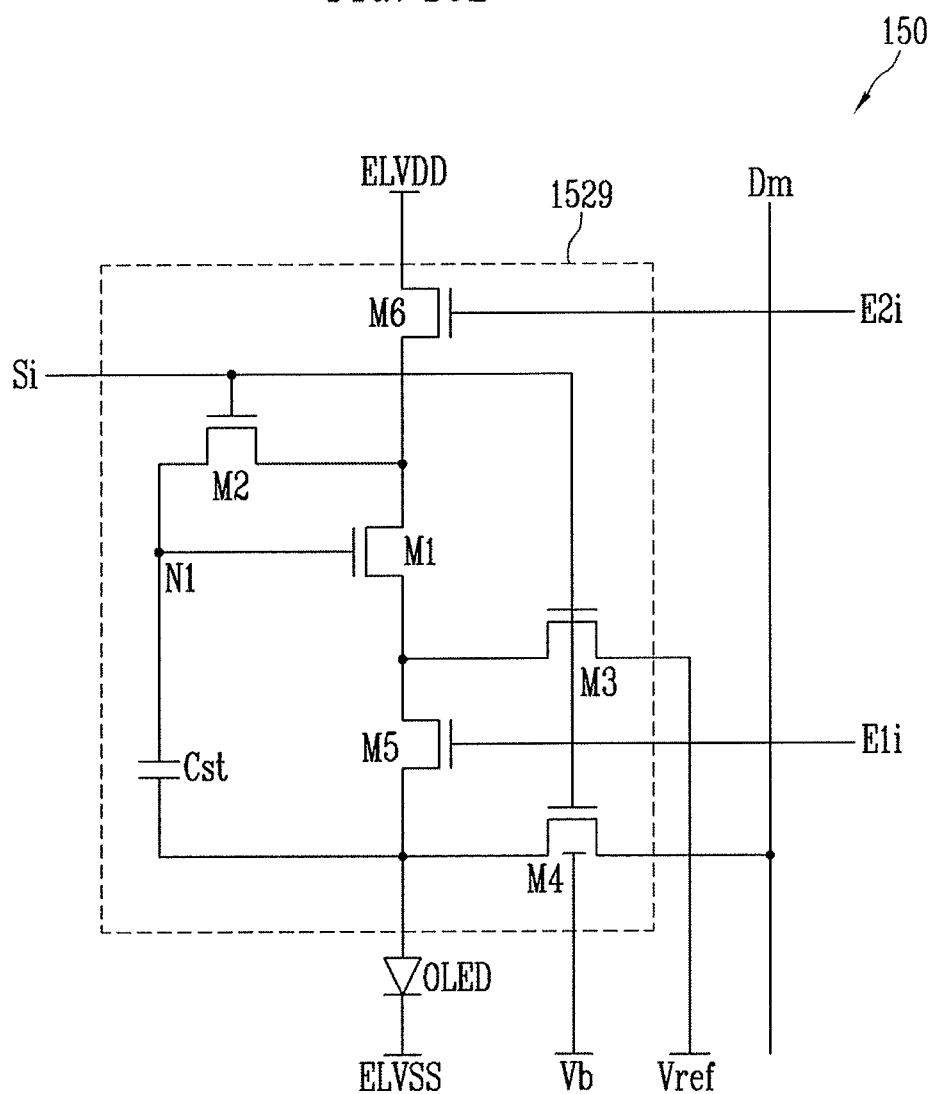

FIGS. 16A and 16B are diagrams illustrating a pixel according to an embodiment of the present disclosure.

Referring to FIG. 16A, a pixel 150 according to an embodiment of the present disclosure may include a pixel circuit 1529 and an organic light-emitting diode (OLED).

An anode electrode of the OLED is coupled to the pixel circuit 1529, and a cathode electrode of the OLED is coupled to a second driving power source ELVSS. Such an OLED generates light having predetermined luminance depending on the amount of current supplied from the pixel circuit 1529.

The pixel circuit 1529 controls the amount of current that flows from a first driving power source ELVDD into the second driving power source ELVSS via the OLED based on a data signal. The configuration of the pixel circuit 1529 is substantially identical to that of the pixel of FIG. 2 except for a fourth transistor M4(D).

The fourth transistor M4(D) is coupled between the anode electrode of the OLED and a data line Dm. Further, the first gate electrode G1 and the second gate electrode G2 of the fourth transistor M4(D) are coupled to a scan line Si. That is, the fourth transistor M4(D) is set to a double-gate transistor, and the first gate electrode G1 and the second gate electrode G2 thereof are coupled to the scan line Si. In this case, the mobility of the fourth transistor M4(D) may be improved, and thus the reliability of operation may be secured.

Additionally, the second gate electrode G2 of the fourth transistor M4(D) may be coupled to a bias power source Vb, as illustrated in FIG. 16B. Here, the voltage of the bias power source Vb may be changed at predetermined time intervals so that the threshold voltage of the fourth transistor M4(D) is maintained in an initial state. For example, the voltage of the bias power source Vb may be compared with a voltage that is supplied to the gate electrode G1 and may then be periodically changed to have a high voltage or a low voltage so that the threshold voltage of the fourth transistor M4(D) is negatively or positively shifted. When the threshold voltage of the fourth transistor M4(D) is maintained in the initial state, the reliability of operation may be secured.

Figure 17A:
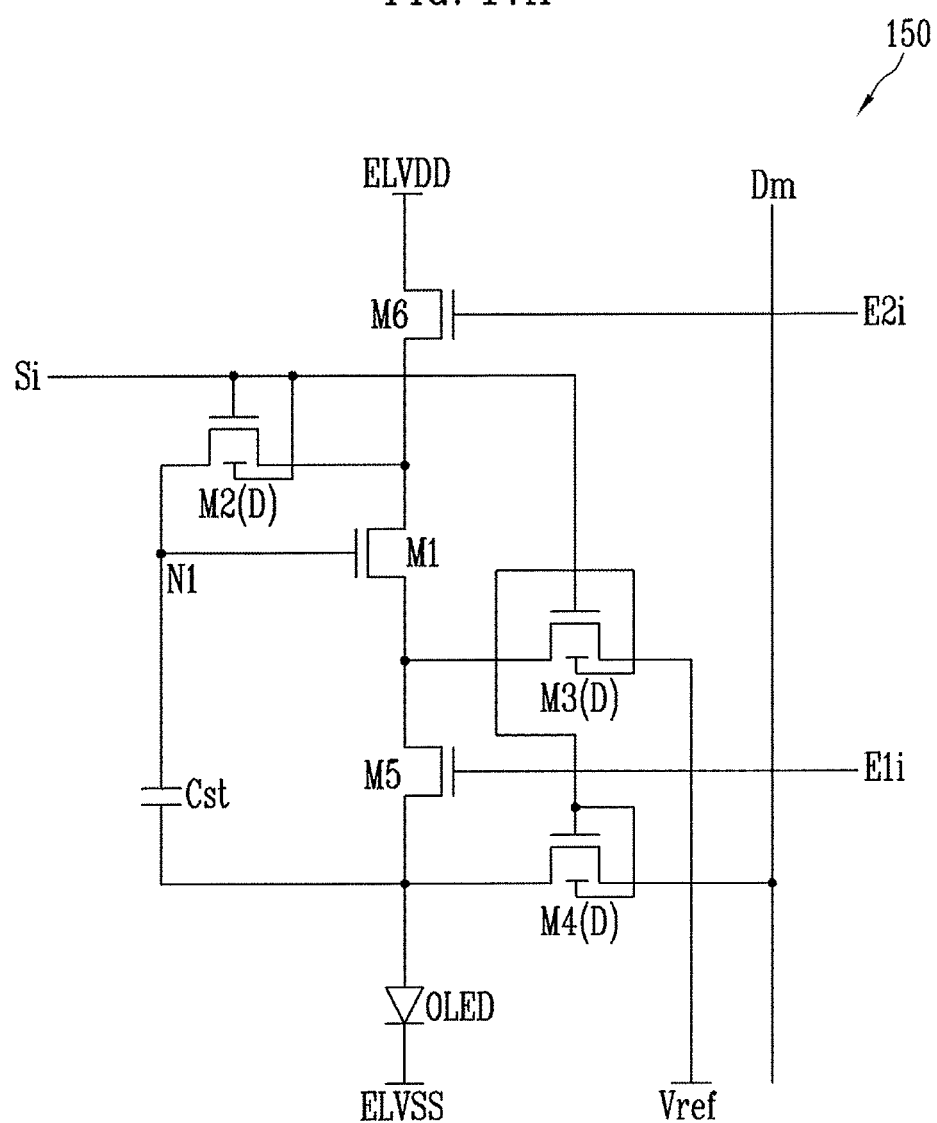
FIGS. 17A and 17B illustrate another embodiment of a pixel.
Figure 17B:
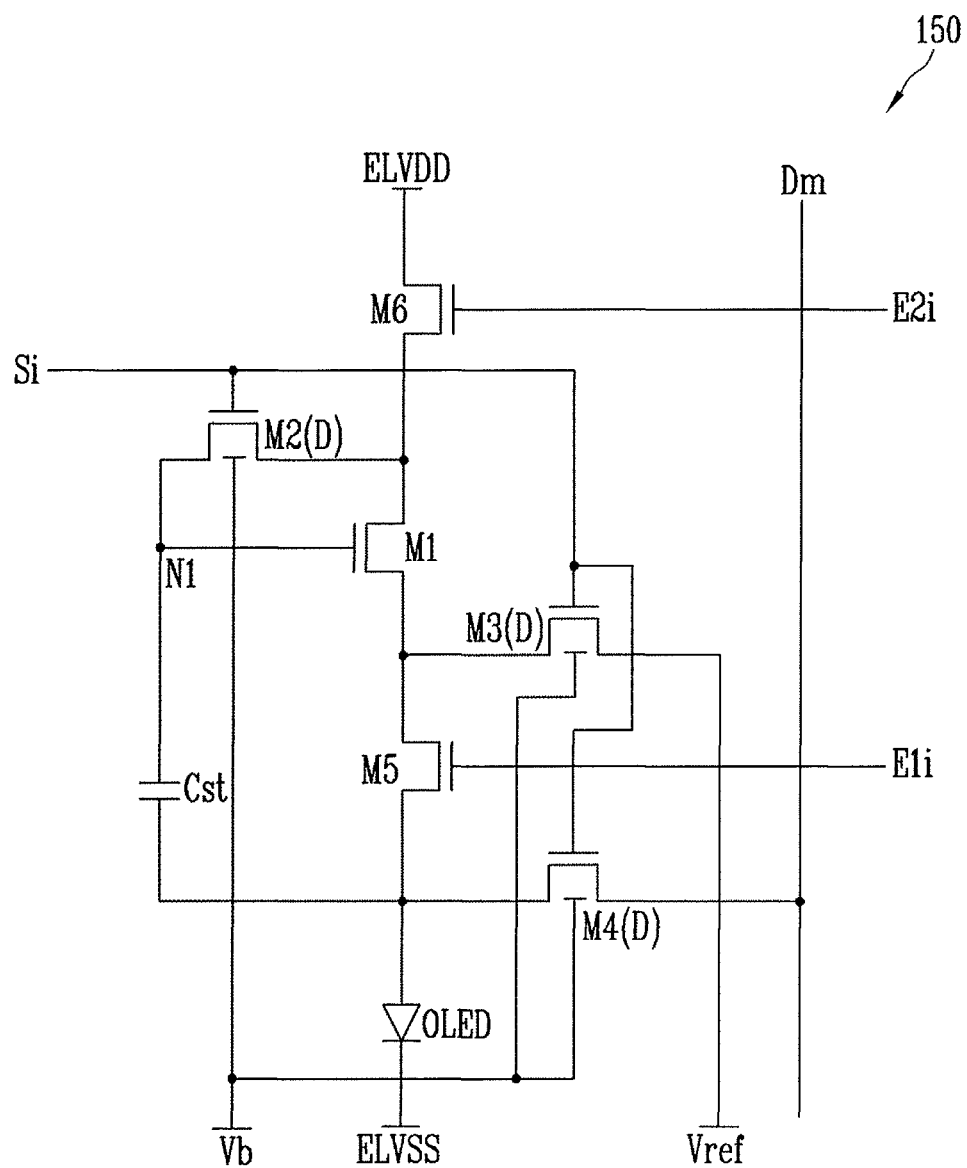

On the other hand, although any one of the second to fourth transistors M2 to M4 is illustrated as being implemented as a double-gate transistor in FIGS. 14A to 16B, the present disclosure is not limited thereto. For example, in an embodiment of the present disclosure, at least one of the second to fourth transistors M2 to M4 may be implemented as a double-gate transistor. In other words, as shown in FIGS. 17A and 17B, the second transistor M2(D), the third transistor M3(D), and the fourth transistor M4(D) may be implemented as respective double-gate transistors.

When the second transistor M2(D), the third transistor M3(D), and the fourth transistor M4(D) are implemented as respective double-gate transistors, mobility may be improved or a threshold voltage may be maintained in an initial state, thus enabling the reliability of operation to be secured.

Figure 18:
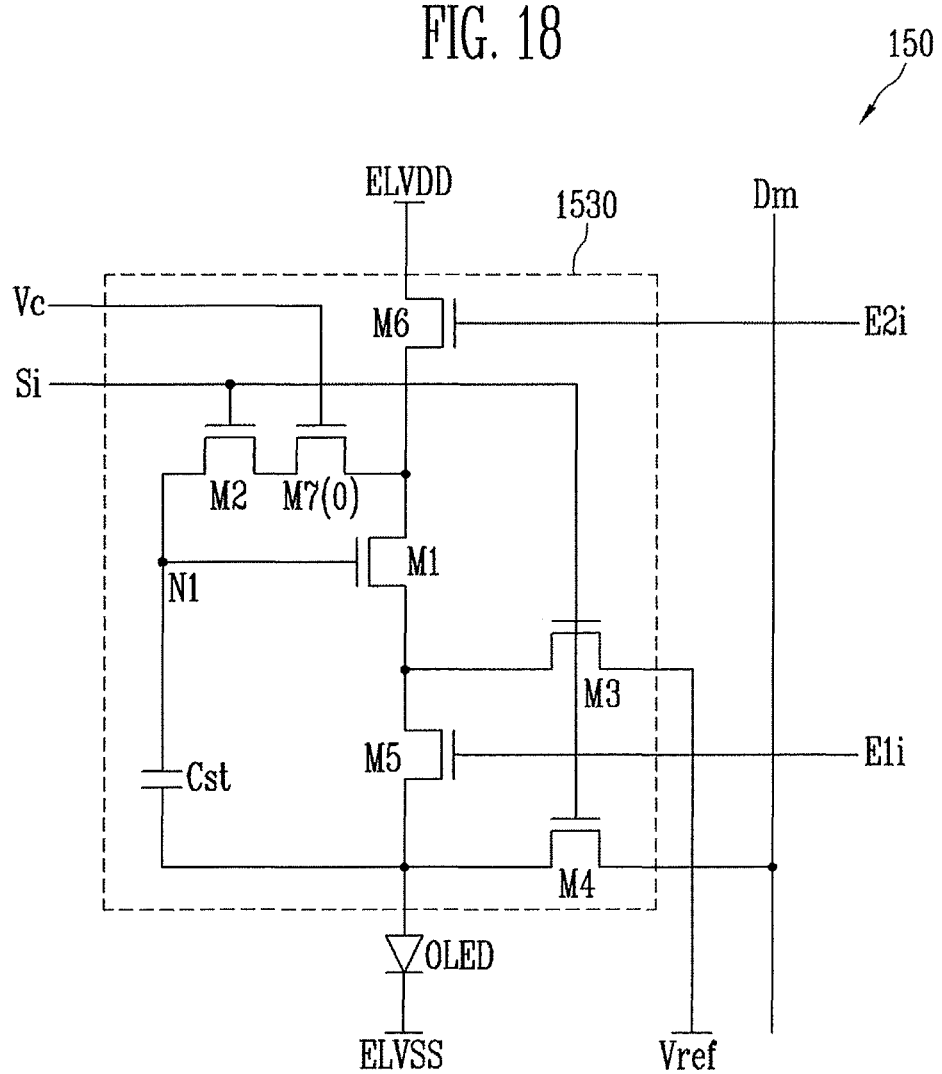
FIG. 18 illustrates another embodiment of a pixel.

FIG. 18 is a diagram illustrating a pixel according to an embodiment of the present disclosure. In the description of FIG. 18, the same reference numerals are allocated to components identical to those of FIG. 2, and thus a detailed description thereof will be omitted.

Referring to FIG. 18, a pixel 150 according to an embodiment of the present disclosure may include a pixel circuit 1530 and an organic light-emitting diode (OLED).

An anode electrode of the OLED is coupled to the pixel circuit 1530, and a cathode electrode of the OLED is coupled to a second driving power source ELVSS. Such an OLED generates light having predetermined luminance depending on the amount of current supplied from the pixel circuit 1530.

The pixel circuit 1530 controls the amount of current that flows from a first driving power source ELVDD into the second driving power source ELVSS via the OLED based on a data signal. Such a pixel circuit 1530 is additionally provided with a seventh transistor M7(O), compared to the configuration of FIG. 2.

The seventh transistor M7(O) is coupled between a second transistor M2 and a first electrode of a first transistor M1. Also, a gate electrode of the seventh transistor M7(O) is coupled to a control power source Vc.

When the pixel 150 is driven at a first driving frequency, for example, at a normal driving frequency, the seventh transistor M7(O) remains turned on. That is, the voltage of the control power source Vc is set such that the seventh transistor M7(O) may be turned on during a period in which the organic light-emitting display device is driven at the first driving frequency.

When the seventh transistor M7(O) is turned on, the second transistor M2 is electrically coupled to the first electrode of the first transistor M1. Therefore, during the period in which the organic light-emitting display device is driven at the first driving frequency, the pixel of FIG. 18 is driven using the same method as the pixel of FIG. 2. Meanwhile, during a period in which the organic light-emitting display device is driven at a second driving frequency lower than the first driving frequency, that is, at a low frequency, the seventh transistor M7(O) is turned off.

Figure 19:
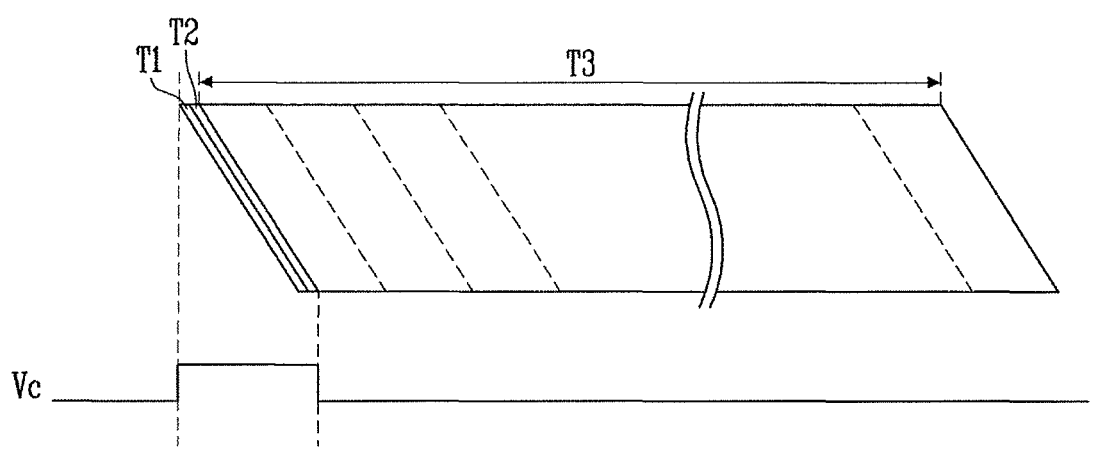
FIG. 19 illustrates an embodiment for driving a pixel at a second driving frequency.

FIG. 19 is a diagram illustrating a case where the pixel of FIG. 18 is driven at a second driving frequency.

Referring to FIG. 19, low-frequency driving is performed such that, after a data signal has been supplied to the pixel 150, the light emission of the pixel 150 is maintained while the voltage of the data signal is maintained for a predetermined period of time. For example, when a still image is displayed by a pixel unit 140, the driving frequency of the organic light-emitting display device may change from the first driving frequency to the second driving frequency. When the organic light-emitting display device is driven at the second driving frequency, the number of times the data signal is supplied is reduced, and thus power consumption is decreased.

When an operation procedure is described, the voltage of the control power source Vc is set to allow the seventh transistor M7(O) to be turned on during a first period T1 and a second period T2 in which data signals are supplied to pixels 150. Then, the voltage of a data signal is normally supplied to each pixel 150.

After the data signal has been supplied to each pixel 150, the voltage of the control power source Vc is set to allow the seventh transistor M7(O) to be turned off, and thus the seventh transistor M7(O) is turned off.

When the seventh transistor M7(O) is turned off, a change in the voltage of the first node N1 attributable to a leakage current is minimized. Therefore, even if the organic light-emitting display device is driven at the second driving frequency, light having desired luminance may be generated by each pixel 150.

Further, in an embodiment of the present disclosure, the seventh transistor M7(O) is implemented as an oxide semiconductor transistor. When the seventh transistor M7(O) is implemented as an oxide semiconductor transistor, a leakage current from the first node N1 may be minimized.

Figure 20:
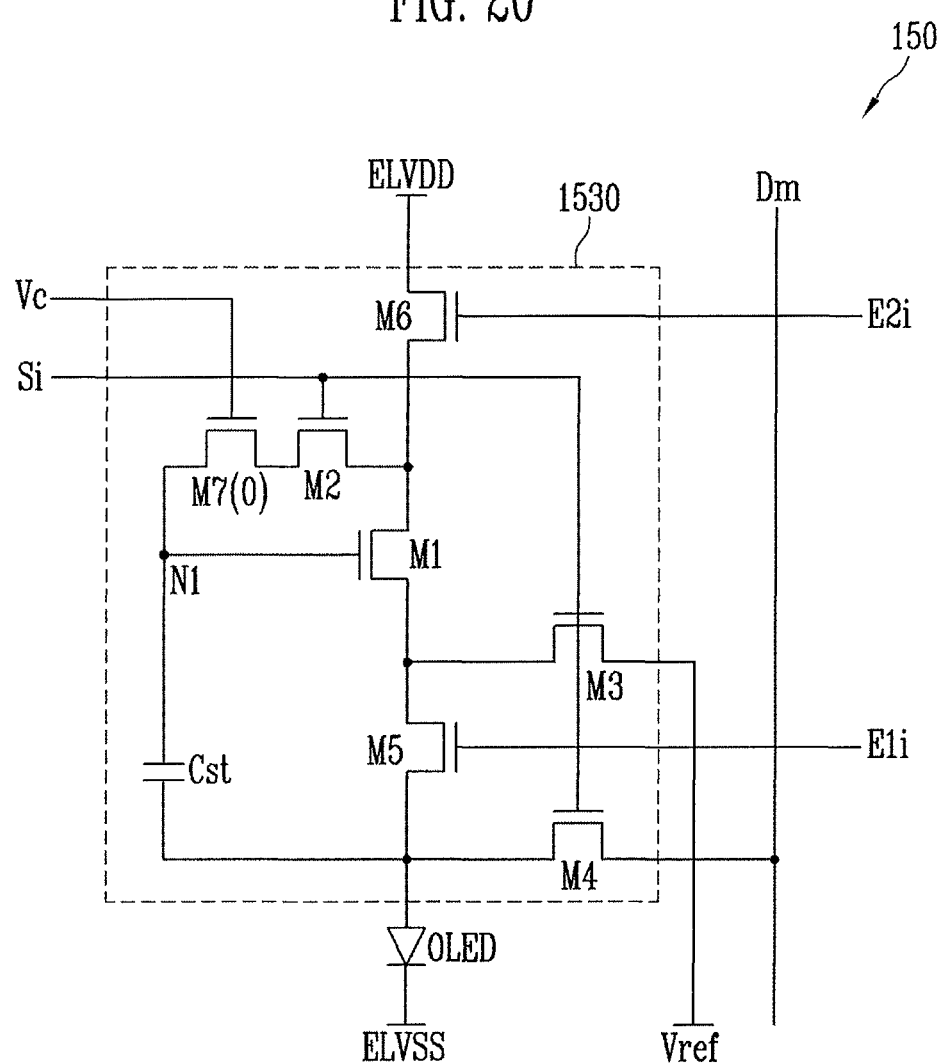
FIG. 20 illustrates another embodiment of a pixel.

Meanwhile, in an embodiment of the present disclosure, as shown in FIG. 20, a seventh transistor M7(O) may be formed between the first node N1 and the second transistor M2. Also, the gate electrode of the seventh transistor M7(O) is coupled to the control power source Vc. Such a seventh transistor M7(O) is turned on or off based on the voltage of the control power source Vc. When the seventh transistor M7(O) is turned off, a leakage current from the first node N1 is minimized.

Figure 21A:
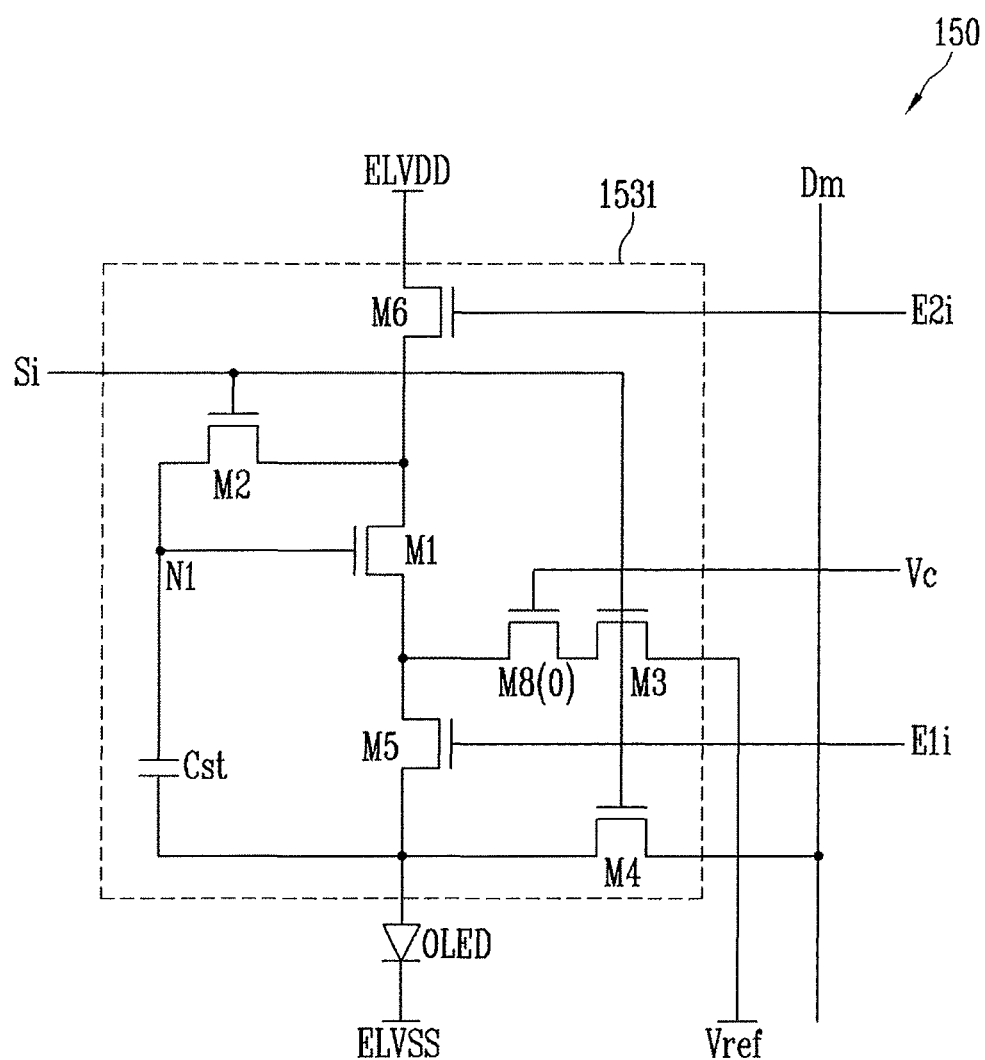
FIGS. 21A and 21B illustrate another embodiment of a pixel.
Figure 21B:
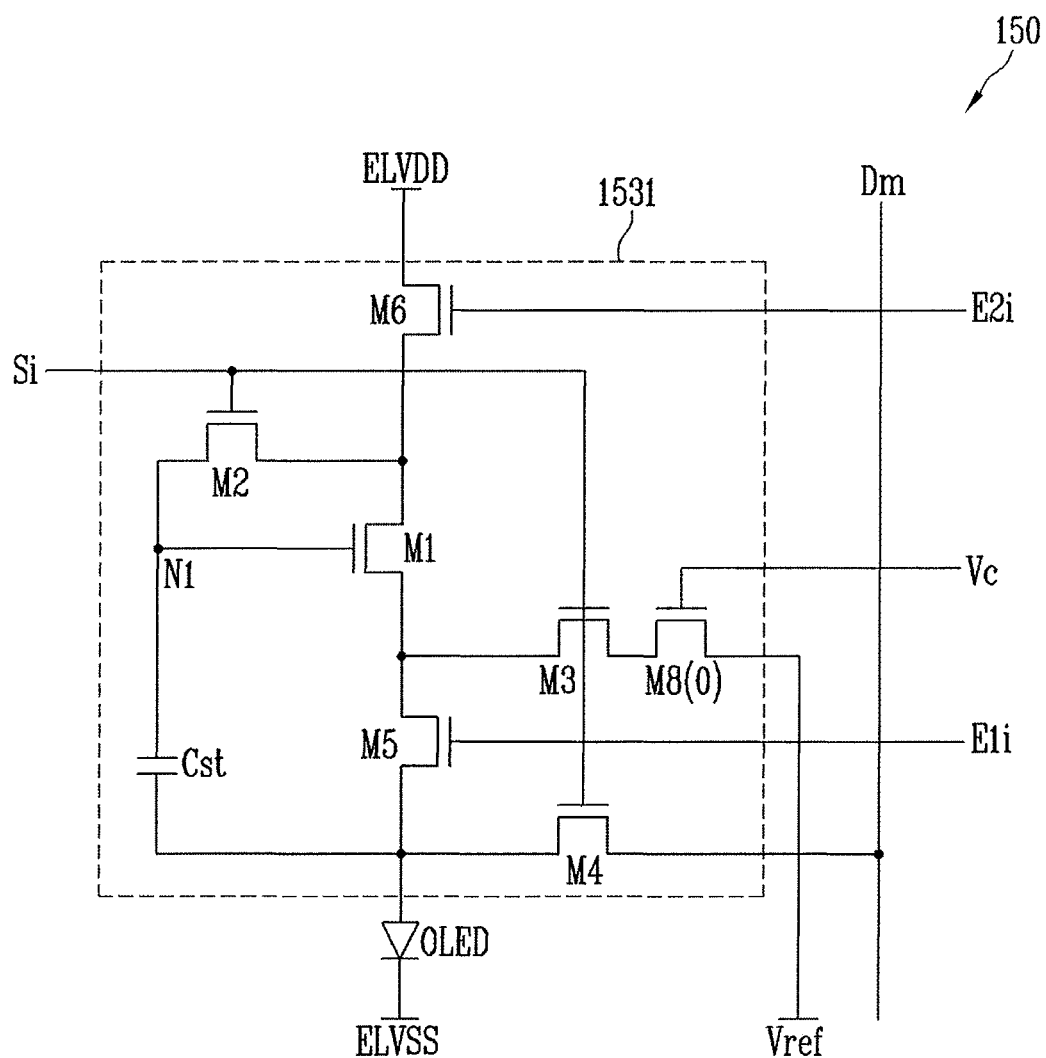

FIGS. 21A and 21B are diagrams illustrating a pixel according to an embodiment of the present disclosure. In the description of FIGS. 21A and 21B, the same reference numerals are allocated to components identical to those of FIG. 2, and thus a detailed description thereof will be omitted.

Referring to FIG. 21A, a pixel 150 according to an embodiment of the present disclosure may include a pixel circuit 1531 and an organic light-emitting diode (OLED).

An anode electrode of the OLED is coupled to the pixel circuit 1531, and a cathode electrode of the OLED is coupled to a second driving power source ELVSS. Such an OLED generates light having predetermined luminance depending on the amount of current supplied from the pixel circuit 1531.

The pixel circuit 1531 controls the amount of current that flows from a first driving power source ELVDD into the second driving power source ELVSS via the OLED based on a data signal. Such a pixel circuit 1531 is additionally provided with an eighth transistor M8(O), compared to the configuration of FIG. 2.

The eighth transistor M8(O) is coupled between a second electrode of a first transistor M1 and a third transistor M3. Additionally, as shown in FIG. 21B, the eighth transistor M8(O) may be coupled between the third transistor M3 and a reference power source Vref. A gate electrode of the eighth transistor M8(O) is coupled to a control power source Vc.

When the pixel 150 is driven at a first driving frequency, for example, at a normal driving frequency, the eighth transistor M8(O) remains turned on. That is, the voltage of the control power source Vc is set such that the eighth transistor M8(O) may be turned on during a period in which the organic light-emitting display device is driven at the first driving frequency.

When the eighth transistor M8(O) is turned on, electrical coupling between the second electrode of the first transistor M1 and the third transistor M3 or between the third transistor M3 and the reference power source Vref is made. Therefore, during the period in which the organic light-emitting display device is driven at the first driving frequency, the pixels of FIGS. 21A and 21B are driven using the same method as the pixel of FIG. 2.

During a period in which the organic light-emitting display device is driven at a second driving frequency lower than the first driving frequency, that is, at a low frequency, the eighth transistor M8(O) is turned off. For example, as shown in the driving waveform of FIG. 19, the voltage of the control power source Vc is set to allow the eighth transistor M8(O) to be turned on during a first period T1 and a second period T2 in which data signals are supplied to pixels 150. Then, the voltage of a data signal is normally supplied to each pixel 150.

After the data signal has been supplied to each pixel 150, the voltage of the control power source Vc is set to allow the eighth transistor M8(O) to be turned off. Thus, the eighth transistor M8(O) is turned off. When the eighth transistor M8(O) is turned off, any leakage current between the second electrode of the first transistor M1 and the reference power source Vref may be reduced or minimized. Thus, an image with a desired luminance may be displayed.

In one embodiment, the eighth transistor M8(O) is an oxide semiconductor transistor. When the eighth transistor M8(O) is an oxide semiconductor transistor, any leakage current between the second electrode of the first transistor M1 and the reference power source Vref may be reduced or minimized.

Figure 22A:
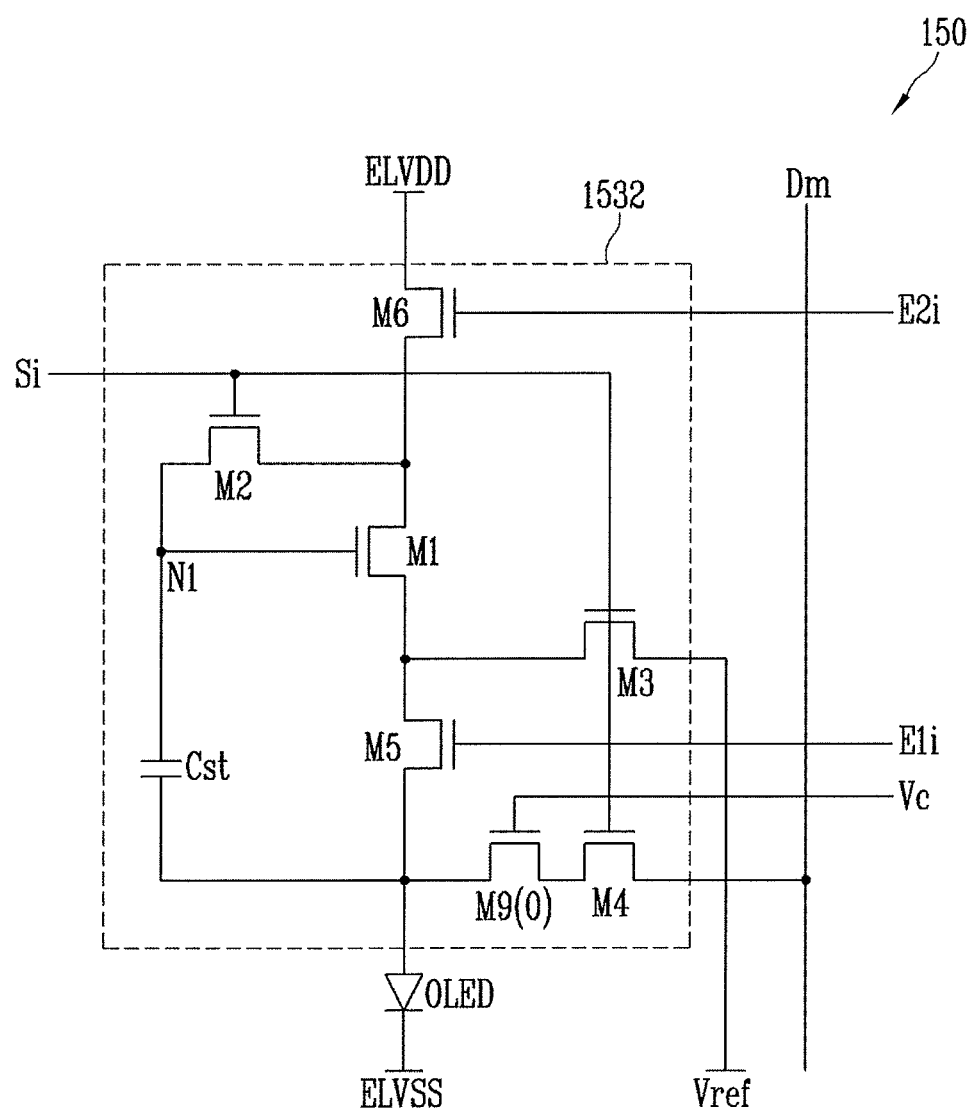
FIGS. 22A and 22B illustrate another embodiment of a pixel.
Figure 22B:
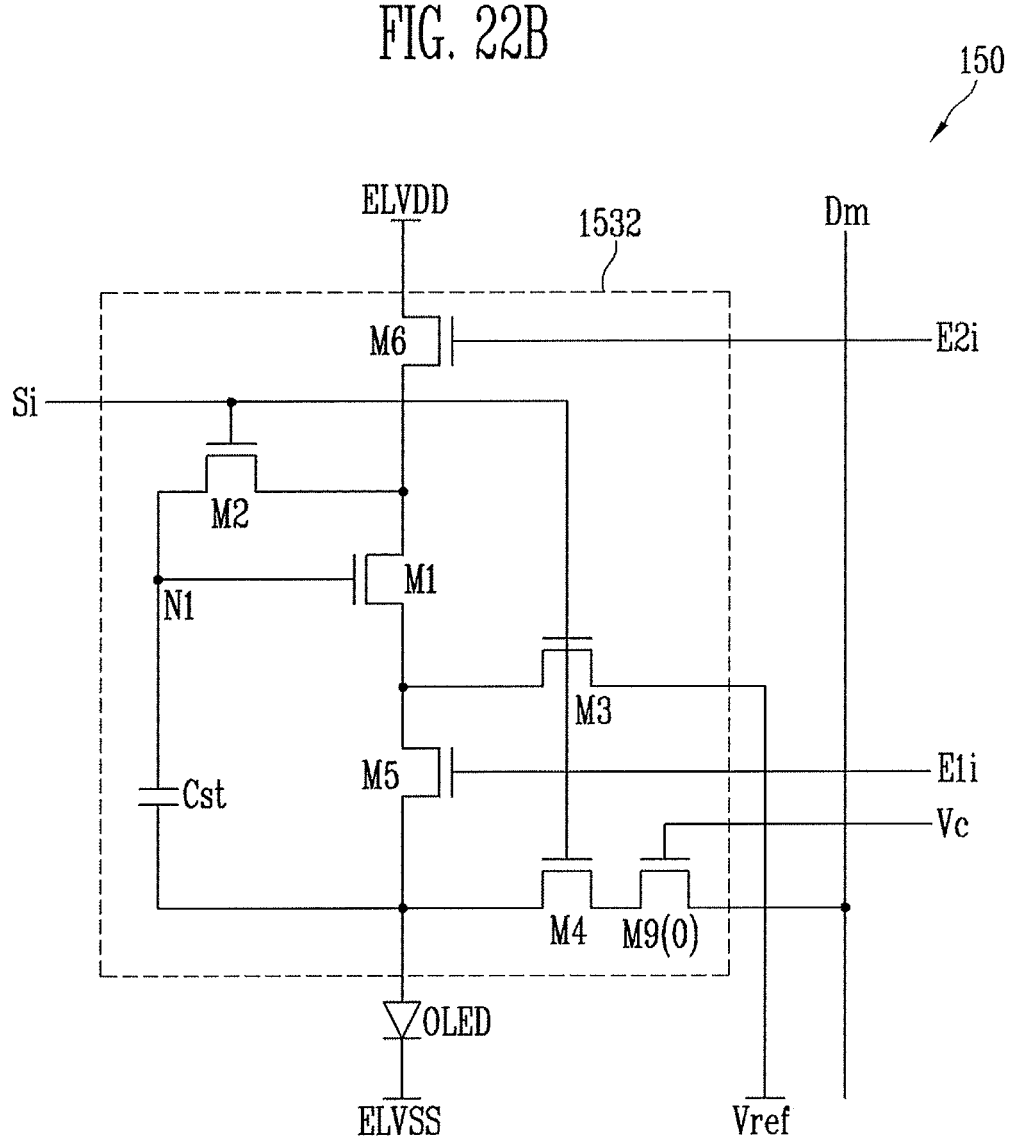

FIGS. 22A and 22B illustrates additional embodiments of a pixel 150 which may include a pixel circuit 1532 and an organic light-emitting diode (OLED). An anode electrode of the OLED is coupled to the pixel circuit 1532, and a cathode electrode of the OLED is coupled to a second driving power source ELVSS. The OLED emits light with a predetermined luminance depending on the amount of current supplied from the pixel circuit 1532.

The pixel circuit 1532 controls the amount of current that flows from a first driving power source ELVDD to the second driving power source ELVSS, via the OLED, based on a data signal. The pixel circuit 1532 is additionally provided with a ninth transistor M9(O), compared to the configuration of FIG. 2.

The ninth transistor M9(O) is coupled between the anode electrode of the OLED and a fourth transistor M4. As shown in FIG. 22B, the ninth transistor M9(O) may be coupled between the fourth transistor M4 and a data line Dm. A gate electrode of the ninth transistor M9(O) is coupled to the control power source Vc.

When the pixel 150 is driven at a first driving frequency, for example, at a normal driving frequency, the ninth transistor M9(O) remains turned on. For example, the voltage of the control power source Vc is set such that ninth transistor M9(O) may be turned on during a period in which the organic light-emitting display device is driven at the first driving frequency.

When the ninth transistor M9(O) is turned on, electrical coupling between the anode electrode of the OLED and the fourth transistor M4 or between the data line Dm and the fourth transistor M4 occurs. Therefore, during the period in which the organic light-emitting display device is driven at the first driving frequency, the pixels of FIGS. 22A and 22B may be driven using the same method as the pixel of FIG. 2.

During a period in which the organic light-emitting display device is driven at a second driving frequency lower than the first driving frequency, that is, at a low frequency, the ninth transistor M9(O) is turned off. For example, as shown in the driving waveform of FIG. 19, the voltage of the control power source Vc is set to allow the ninth transistor M9(O) to be turned on during a first period T1 and a second period T2 in which data signals are supplied to pixels 150. Then, the voltages of data signals are normally supplied to respective pixels 150.

After the data signal has been supplied to each pixel 150, the voltage of the control power source Vc is set to allow the ninth transistor M9(O) to be turned off. Thus, the ninth transistor M9(O) is turned off. When the ninth transistor M9(O) is turned off, any leakage current between the OLED and the data line Dm may be reduced or minimized. Thus, an image having desired luminance may be displayed.

In an embodiment, the ninth transistor M9(O) is an oxide semiconductor transistor. When the ninth transistor M9(O) is an oxide semiconductor transistor, any leakage current between the OLED and the data line Dm may be reduced or minimized.

Figure 23A:
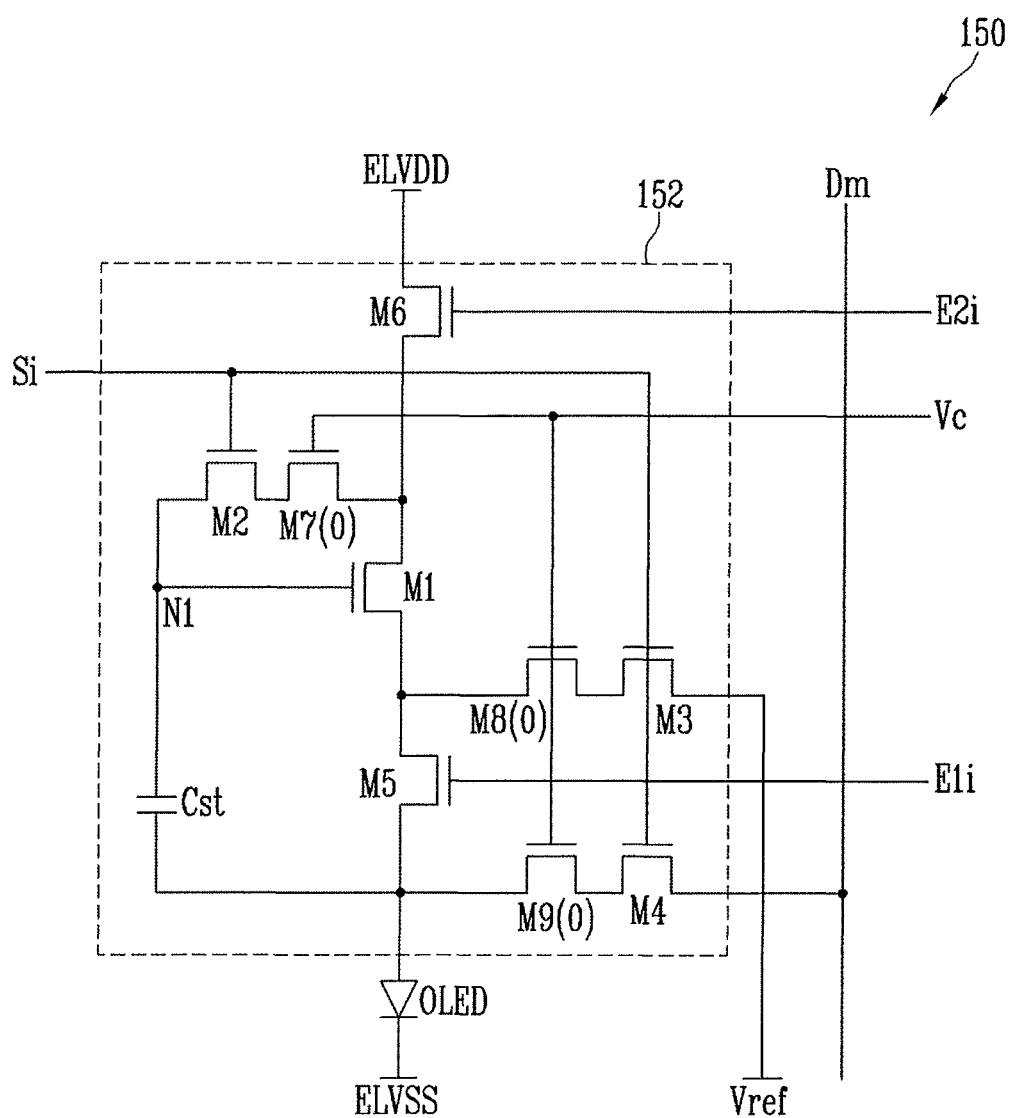
FIGS. 23A and 23B another embodiment of a pixel.
Figure 23B:
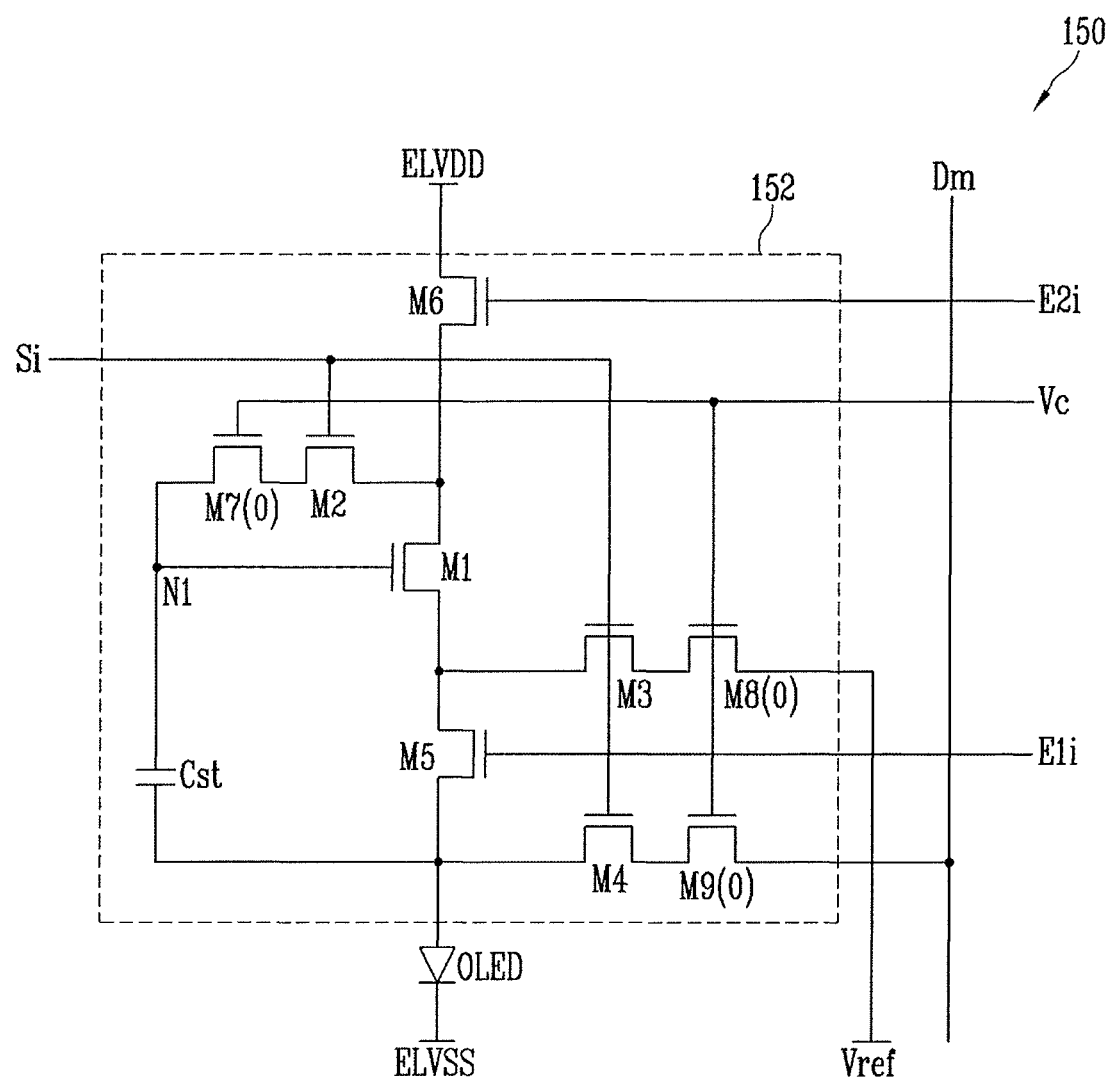

Any one of the seventh transistor M7(O), the eighth transistor M8(O), and the ninth transistor M9(O) may be in the pixel 150 in FIGS. 18, 20, and 21A to 22B. In an embodiment, at least one of the seventh transistor M7(O), the eighth transistor M8(O), and the ninth transistor M9(O) may be in the pixel 150. In other words, as shown in FIGS. 23A and 23B, all of the seventh transistor M7(O), the eighth transistor M8(O), and the ninth transistor M9(O) may be formed in the pixel 150.

When all of the seventh transistor M7(O), the eighth transistor M8(O), and the ninth transistor M9(O) are in the pixel 150, any current leaking from a current path during a third period T3 in which the OLED emits light may be reduced or minimized. Thus, an image with a desired luminance may be displayed. In particular, when all of the seventh transistor M7(O), the eighth transistor M8(O), and the ninth transistor M9(O) are oxide semiconductor transistors, an image having desired luminance may be stably displayed, even when the pixel 150 is driven at a low frequency.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, drivers, and other signal generating and signal processing features of the disclosed embodiments may be implemented in logic which, for example, may include hardware, software, or both. When implemented at least partially in hardware, the controllers, drivers, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, drivers, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, at least one transistor in a current leakage path is an oxide semiconductor transistor. Thus, leakage current may be reduced or minimized, and an image with a desired luminance may be displayed.

In accordance with one or more of the aforementioned embodiments, at least one transistor in a current leakage path is implemented as a double-gate transistor or a dual gate transistor. As a result, leakage current may be reduced or minimized, and an image with a desired luminance may be displayed.

In accordance with one or more of the aforementioned embodiments, a pixel may include at least one transistor in a current leakage path that is turned off when driven at a low frequency and remains turned on in other driving cases. When the pixel is driven at a low frequency, any leakage current that occurs may be reduced or minimized, and thus an image with a desired luminance may be displayed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A pixel, comprising:
an organic light-emitting diode;
a first transistor to control an amount of current that flows from a first driving power source to a second driving power source, via the organic light-emitting diode, based on a voltage of a first node;
a second transistor coupled between a first electrode of the first transistor and the first node, the second transistor to be turned on when a scan signal is supplied to a scan line;
a third transistor coupled between a second electrode of the first transistor and a reference power source, the third transistor to be turned on when the scan signal is supplied;
a fourth transistor coupled between an anode electrode of the organic light-emitting diode and a data line, the fourth transistor to be turned on when the scan signal is supplied; and
a storage capacitor coupled between the first node and the anode electrode of the organic light-emitting diode, wherein
the reference power source provides a constant DC voltage while a data signal is applied on the data line, the first transistor is a polysilicon semiconductor transistor, and
at least one of the second transistor, the third transistor, or the fourth transistor is an oxide semiconductor transistor.

2. The pixel as claimed in claim 1, further comprising:
a fifth transistor coupled between the second electrode of the first transistor and the anode electrode of the organic light-emitting diode, the fifth transistor to be turned off when a first emission control signal is supplied to a first emission control line; and
a sixth transistor coupled between the first driving power source and the first electrode of the first transistor, the sixth transistor to be turned off when a second emission control signal is supplied to a second emission control line.

3. The pixel as claimed in claim 2, wherein the second transistor has a turn-on period that does not overlap a turn-on period of the fifth transistor.

4. The pixel as claimed in claim 2, wherein the second transistor has a turn-on period that partially overlaps a turn-on period of the sixth transistor.

5. The pixel as claimed in claim 2, wherein each of the first to sixth transistors is an N-type transistor.

6. The pixel as claimed in claim 2, wherein the fifth transistor, and the sixth transistor are polysilicon semiconductor transistors.

7. The pixel as claimed in claim 1, wherein the first driving power source is to have a voltage higher than that of the reference power source.

8. The pixel as claimed in claim 1, wherein a data signal from the data line is to have a voltage lower than that of the second driving power source.

9. The pixel as claimed in claim 1, wherein at least one of the second transistor, the third transistor, or the fourth transistor includes a plurality of transistors connected in series.

10. The pixel as claimed in claim 1, wherein at least one of the second transistor, the third transistor, or the fourth transistor is a double-gate transistor with two gate electrodes.

11. The pixel as claimed in claim 10, wherein a first gate electrode and a second gate electrode of the second transistor are coupled to the scan line.

12. The pixel as claimed in claim 10, wherein:
a first gate electrode of the second transistor is coupled to the scan line, and
a second gate electrode of the second transistor is coupled to a bias power source.

13. The pixel as claimed in claim 12, wherein a voltage of the bias power source is to be changed at predetermined intervals, so that the bias power source has a voltage lower than or higher than a voltage supplied to the first gate electrode.

14. The pixel as claimed in claim 10, wherein a first gate electrode and a second gate electrode of the third transistor are coupled to the scan line.

15. The pixel as claimed in claim 10, wherein:
a first gate electrode of the third transistor is coupled to the scan line, and
a second gate electrode of the third transistor is coupled to a bias power source.

16. The pixel as claimed in claim 15, wherein a voltage of the bias power source is changed at predetermined intervals, so that the bias power source has a voltage lower than or higher than a voltage that is supplied to the first gate electrode.

17. The pixel as claimed in claim 10, wherein a first gate electrode and a second gate electrode of the fourth transistor are coupled to the scan line.

18. The pixel as claimed in claim 10, wherein:
a first gate electrode of the fourth transistor is coupled to the scan line, and
a second gate electrode of the fourth transistor is coupled to a bias power source.

19. The pixel as claimed in claim 18, wherein a voltage of the bias power source is to be changed at predetermined intervals, so that the bias power source has a voltage lower than or higher than a voltage that is supplied to the first gate electrode.

20. The pixel as claimed in claim 1, further comprising:
a fifth transistor coupled between the first electrode of the first transistor and the second transistor or between the first node and the second transistor, the fifth transistor having a gate electrode coupled to a control power source.

21. The pixel as claimed in claim 20, wherein the fifth transistor is an oxide semiconductor transistor.

22. The pixel as claimed in claim 20, wherein:
when the pixel is driven at a first driving frequency, a voltage of the control power source is to allow the fifth transistor to remain turned on, and
when the pixel is driven at a second driving frequency lower than the first driving frequency, the voltage of the control power source is to allow the fifth transistor to be turned off.

23. The pixel as claimed in claim 22, wherein:
when the pixel is driven at the second driving frequency, the fifth transistor is to be turned off after a voltage of a data signal is stored in the storage capacitor.

24. The pixel as claimed in claim 1, further comprising:
a fifth transistor coupled between the second electrode of the first transistor and the third transistor or between the third transistor and the reference power source, the fifth transistor having a gate electrode coupled to a control power source.

25. The pixel as claimed in claim 24, wherein the fifth transistor is an oxide semiconductor transistor.

26. The pixel as claimed in claim 24, wherein:
when the pixel is driven at a first driving frequency, a voltage of the control power source is to allow the fifth transistor to remain turned on, and
when the pixel is driven at a second driving frequency lower than the first driving frequency, the voltage of the control power source is to allow the fifth transistor to be turned off.

27. The pixel as claimed in claim 26, wherein:
when the pixel is driven at the second driving frequency, the fifth transistor is to be turned off after a voltage of a data signal is stored in the storage capacitor.

28. The pixel as claimed in claim 1, further comprising:
a fifth transistor coupled between the anode electrode of the organic light-emitting diode and the fourth transistor or between the fourth transistor and the data line, the fifth transistor having a gate electrode coupled to a control power source.

29. The pixel as claimed in claim 28, wherein the fifth transistor is an oxide semiconductor transistor.

30. The pixel as claimed in claim 28, wherein:
when the pixel is driven at a first driving frequency, a voltage of the control power source is to allow the fifth transistor to remain turned on, and when the pixel is driven at a second driving frequency lower than the first driving frequency, the voltage of the control power source is to allow the fifth transistor to be turned off.

31. The pixel as claimed in claim 30, wherein:
when the pixel is driven at the second driving frequency, the fifth transistor is to be turned off after a voltage of a data signal is stored in the storage capacitor.

32. An organic light-emitting display device, comprising:
a plurality of pixels coupled to scan lines, data lines, first emission control lines, and second emission control lines;
a scan driver to supply a scan signal to the scan lines; and
an emission driver to supply a first emission control signal to the first emission control lines and supply a second emission control signal to the second emission control lines, wherein a pixel among the pixels in an i-th horizontal line includes:
an organic light-emitting diode;
a first transistor to control an amount of current that flows from a first driving power source into a second driving power source, via the organic light-emitting diode, based on a voltage of a first node;
a second transistor coupled between a first electrode of the first transistor and the first node, the second transistor to be turned on when a scan signal is supplied to an i-th scan line;
a third transistor coupled between a second electrode of the first transistor and a reference power source, the third transistor to be turned on when the scan signal is supplied to the i-th scan line;
a fourth transistor coupled between an anode electrode of the organic light-emitting diode and a data line, the fourth transistor to be turned on when the scan signal is supplied to the i-th scan line; and
a storage capacitor coupled between the first node and the anode electrode of the organic light-emitting diode, wherein
the reference power source provides a constant DC voltage while a data signal is applied on the data line,
the first transistor is a polysilicon semiconductor transistor, and
at least one of the second transistor, the third transistor, or the fourth transistor is an oxide semiconductor transistor.

33. The organic light-emitting display device as claimed in claim 32, wherein the pixel includes:
a fifth transistor coupled between the second electrode of the first transistor and the anode electrode of the organic light-emitting diode, the fifth transistor to be turned off when the first emission control signal is supplied to an i-th first emission control line; and
a sixth transistor coupled between the first driving power source and the first electrode of the first transistor, the sixth transistor to be turned off when the second emission control signal is supplied to an i-th second emission control line.

34. The organic light-emitting display device as claimed in claim 33, wherein the emission driver is to supply the second emission control signal to the i-th second emission control line after supplying the first emission control signal to the i-th first emission control line.

35. The organic light-emitting display device as claimed in claim 34, wherein the second emission control signal supplied to the i-th second emission control line has a period that partially overlaps a period of the first emission control signal supplied to the i-th first emission control line.

36. The organic light-emitting display device as claimed in claim 33, wherein the scan driver is to supply the scan signal to the i-th scan line, so that a period of the scan signal completely overlaps a period of the first emission control signal supplied to the i-th first emission control line and partially overlaps a period of the second emission control signal supplied to the i-th second emission control line.

37. The organic light-emitting display device as claimed in claim 33, wherein each of the first to sixth transistors is an N-type transistor.

38. The organic light-emitting display device as claimed in claim 32, wherein the first driving power source is to have a voltage higher than that of the reference power source.

39. The organic light-emitting display device as claimed in claim 32, wherein a data signal is to have a voltage lower than that of the second driving power source.

* * * * *